(12) United States Patent
Usui et al.

(10) Patent No.: US 6,812,051 B2
(45) Date of Patent: *Nov. 2, 2004

(54) METHOD OF FORMING AN EPITAXIALLY GROWN NITRIDE-BASED COMPOUND SEMICONDUCTOR CRYSTAL SUBSTRATE STRUCTURE AND THE SAME SUBSTRATE STRUCTURE

(75) Inventors: Akira Usui, Tokyo (JP); Masatomo Shibata, Tsuchiura (JP); Yuichi Oshima, Tsuchiura (JP)

(73) Assignees: NEC Corporation, Tokyo (JP); Hitachi Cable, Ltd., Tokyo (JP)

( * ) Notice: Subject to any disclaimer, the term of this patent is extended or adjusted under 35 U.S.C. 154(b) by 96 days.

This patent is subject to a terminal disclaimer.

(21) Appl. No.: 10/150,960

(22) Filed: May 21, 2002

(65) Prior Publication Data

US 2003/0017685 A1 Jan. 23, 2003

(30) Foreign Application Priority Data

May 21, 2001 (JP) ........................................ 2001-151139

(51) Int. Cl.[7] .............................................. H01L 21/20
(52) U.S. Cl. ........................................... 438/22; 438/46
(58) Field of Search ..................... 438/21–47, 479–509, 438/795–797

(56) References Cited

U.S. PATENT DOCUMENTS

| | | | | |
|---|---|---|---|---|
| 6,579,359 B1 | * | 6/2003 | Mynbaeva et al. | ............ 117/94 |
| 2002/0197825 A1 | * | 12/2002 | Usui et al. | ................... 438/459 |
| 2003/0183157 A1 | * | 10/2003 | Usui et al. | ..................... 117/84 |

FOREIGN PATENT DOCUMENTS

| | | | |
|---|---|---|---|
| EP | 1271627 | * | 2/2003 |
| JP | 5-73252 | | 10/1993 |
| JP | 10-321954 | | 12/1998 |
| JP | 4103219954 | * | 12/1998 |
| JP | 2883504 | | 2/1999 |
| JP | 11-121801 | | 4/1999 |
| JP | 11-176758 | | 7/1999 |
| JP | 1126035 | * | 9/1999 |
| JP | 2000-91253 | | 3/2000 |
| JP | 3139445 | | 12/2000 |
| JP | 2000-349338 | | 12/2000 |

OTHER PUBLICATIONS

Nam et al., "Lateral epitaxy of low defect density GaN layers via organometallic vapor phase epitaxy", Appl. Phys. Lett. 71 (18), Nov. 3, 1997, 2638–2640.

Kuramoto et al., "Room–Temperature Continous–Wave Operation of InGaN Multi–Quantum–Well Laser Diodes Grown on an n–GaN Substrate with a Backside n–Contact", Jpn. J. Appln. Phys. vol. 38 (1999) pp. L184–L186.

Zheleva et al., "Pendeo–Epitaxy—A New Approach for Lateral Growth of Gallium Nitride Structures", MRS Internet J. Nitride Semicond. Res. 4S1, G3.38 (1999).

Kim et al., "Relaxation of anisotropic domain tilting along vertical growth direction in selectively lateral overgrown GaN by hydride vapor phase epitaxy", Journal of Crystal Growth 208 (2000) pp. 804–808.

* cited by examiner

Primary Examiner—Savitri Mulpuri
(74) Attorney, Agent, or Firm—Young & Thompson

(57) ABSTRACT

A metal layer is formed directly on a nitride-based compound semiconductor base layer over a substrate body. The metal layer includes at least one metal exhibiting an atomic interaction, with assistance of a heat treatment, to atoms constituting the base layer to promote removal of constitutional atoms from the base layer, whereby pores penetrating the metal layer are formed, while many voids are formed in the nitride-based compound semiconductor base layer. An epitaxial growth of a nitride-based compound semiconductor crystal is made with an initial transient epitaxial growth, which fills the voids, and a subsequent main epitaxial growth over the porous metal layer.

51 Claims, 16 Drawing Sheets

← 4

METHOD OF FORMING AN EPITAXIALLY GROWN NITRIDE-BASED COMPOUND SEMICONDUCTOR CRYSTAL SUBSTRATE STRUCTURE AND THE SAME SUBSTRATE STRUCTURE

BACKGROUND OF THE INVENTION

1. Field of the Invention

The present invention relates to a method of forming an epitaxially grown nitride-based compound semiconductor crystal substrate structure with a reduced dislocation density, and a nitride-based compound semiconductor crystal substrate structure with a reduced dislocation density.

2. Description of the Related Art

Gallium nitride-based compound semiconductors are attractive to persons skilled in the art for a wide variety of applications to various semiconductor devices, for example, light emitting diodes such as a blue-color light emitting diode and laser diodes. The gallium nitride-based compound semiconductors include various compound semiconductors including gallium and nitrogen, for example, gallium nitride (GaN), indium gallium nitride (InGaN), and gallium aluminum nitride (GaAlN), and the like. The gallium nitride-based compound semiconductors are relatively superior in thermal stability and environmental requirements. For these reasons, the requirements for applications of the gallium nitride-based compound semiconductors to advanced various electron devices have now been on the increase.

It has been known to the persons skilled in the art that it is not easy to realize a desired crystal growth in bulk-form or single-layered form of the nitride-based compound semiconductor crystal, while such a single-layered nitride-based compound semiconductor crystal substrate would be desirable, wherein an entirety of the substrate comprises a single layer of a nitride-based compound semiconductor crystal.

In accordance with the current practices, however, it is generally common to use a single crystal sapphire substrate as a base structure for allowing any available epitaxial growth such as a metal organic vapor phase epitaxy of a nitride-based compound semiconductor crystal layer on the sapphire substrate, such that the substrate comprises the single crystal sapphire base structure and an epitaxially grown nitride-based compound semiconductor crystal layer on the base structure.

The sapphire single crystal is different in lattice constant from the nitride-based compound semiconductor crystal. This lattice-mismatch between sapphire and nitride-based compound semiconductor is so large as making it difficult to realize a desirable epitaxial growth of the nitride-based compound semiconductor crystal directly on the surface of the sapphire single crystal. In order to solve the above issue of difficulty, it was proposed that a nitride-based compound semiconductor buffer layer such as aluminum nitride or gallium nitride serving as a buffer layer is grown at a relatively low temperature on the sapphire single crystal for subsequent desirable epitaxial growth of the nitride-based compound semiconductor crystal directly on the surface of the buffer layer, wherein the buffer layer contributes to relax a lattice-strain of the epitaxially grown nitride-based compound semiconductor crystal due to the lattice-mismatch between sapphire and nitride-based compound semiconductor. This conventional technique is disclosed in Japanese laid-open patent publication No. 63-188983, which is incorporated herein as reference.

This relaxation by the buffer layer would allow the epitaxial growth of the nitride-based compound semiconductor crystal, but still be incapable of removing dislocations from the epitaxially grown nitride-based compound semiconductor crystal, wherein the density of such dislocations is likely to be, for example, in the order of about 1E9 to 1E10 $cm^{-2}$. Such dislocation density range would be still higher than a desirable low dislocation density range for practical applications to a variety of gallium nitride-based compound semiconductor devices such as laser diodes and light emitting diodes.

In recent years, some techniques for reducing the density of crystal defects and dislocations of the epitaxially grown gallium nitride crystal over the sapphire single crystal were reported, for example, an epitaxial lateral overgowth as disclosed in Applied Physics Letter 71, (18) 2638 (1997), incorporated herein as a reference, and a facet-initiated epitaxial lateral overgrowth as disclosed in Japan Journal of Applied Physics 38, L184 (1999), incorporated herein as another reference, as well as a pendio-epitaxy as disclosed in MRS Internet Journal Nitride Semiconductor Res. 4S1, G3, 38 (1999), incorporated herein as still another reference.

In accordance with those growth techniques, a patterned $SiO_2$ mask is disposed on a surface of a gallium nitride base layer epitaxially grown over the sapphire substrate, for subsequent selective epitaxial growth of the gallium nitride layer through openings of the patterned $SiO_2$ mask from exposed surface regions of the gallium nitride base layer, wherein a lateral growth of the gallium nitride crystal over the patterned $SiO_2$ mask is caused with changing the epitaxial growth direction of the gallium nitride crystal, so that this change in the epitaxial growth direction contributes to discontinue propagation of the dislocations through openings of the patterned $SiO_2$ mask from exposed surface regions of the gallium nitride base layer. The further development made of those growth techniques results in somewhat effective reductions in the dislocation density into the order of approximately 1E7 $cm^{-2}$. An example of those growth techniques is also disclosed in Japanese laid-open patent publication No. 10-312971, incorporated herein as yet another reference.

The above-described growth techniques utilizing the patterned $SiO_2$ mask, of course, need additional processes for forming the patterned $SiO_2$ mask on the surface of the gallium nitride base layer epitaxially grown over the sapphire substrate. Those additional processes may, for example, be as follows. An $SiO_2$ film is deposited on the surface of the gallium nitride base layer by using any available deposition method such as a chemical vapor deposition method. A resist material is applied on the surface of the $SiO_2$ film. The resist film is then exposed and subsequently developed in photo-lithography processes to obtain a resist pattern on the $SiO_2$ film. The $SiO_2$ film is selectively etched by the resist pattern, followed by removal of the resist pattern and cleaning process, thereby to obtain the patterned $SiO_2$ mask. Those sequential processes for forming the patterned $SiO_2$ mask are complicated and time-consuming processes, and also need highly accurate advanced micro-lithography techniques. This provides a restriction to a desirable improvement in the yield and re-productivity of the patterned $SiO_2$ mask.

The above-described growth techniques, utilizing the patterned $SiO_2$ mask, may also include numerous heat treatment processes and cleaning processes, and cause pollution and damage to the substrate due to handling. Notwithstanding, the above-described growth techniques, utilizing the patterned $SiO_2$ mask, result in still higher dislocation density levels than the desired low levels for practical applications to the advanced laser diode and/or light emitting diode. Namely, the above-described growth techniques do not satisfy the actual requirements for the practical applications. This is because the gallium nitride crystal epitaxially grown over the patterned $SiO_2$ mask exhibits a crystal strain generation due to a difference in growth mechanism or direction between over a region covered by the patterned $SiO_2$ mask and another region uncovered thereby. This crystal strain generation causes a tilt of crystal axis of the gallium nitride crystal. This is disclosed in Journal of Crystal Growth 208 (2000) pp. 804–808, incorporated herein as a reference.

In the above circumstances, the developments of a novel method of forming an epitaxially grown nitride-based compound semiconductor crystal substrate structure as well as such a substrate free from the above problems are desirable.

SUMMARY OF THE INVENTION

Accordingly, it is an object of the present invention to provide a novel method of forming an epitaxially grown nitride-based compound semiconductor crystal substrate structure free from the above problems.

It is a further object of the present invention to provide a novel method of forming an epitaxially grown nitride-based compound semiconductor crystal substrate structure, wherein at least an upper region of the substrate structure has a reduced dislocation or defect density level which is generally lower than a minimum-required low density range for numerous applications to a variety of advanced nitride-based compound semiconductor devices such as the laser diode and light-emitting diodes.

It is a still further object of the present invention to provide a novel method of forming an epitaxially grown single-layered nitride-based compound semiconductor crystal substrate, wherein at least an upper region of the single-layered substrate has a reduced dislocation or defect density level which is generally lower than a minimum-required low density range for numerous applications to a variety of advanced nitride-based compound semiconductor devices such as the laser diode and light-emitting diodes.

It is yet a further object of the present invention to provide a novel method of forming an epitaxially grown single-layered nitride-based compound semiconductor crystal substrate, wherein an entirety of the single-layered substrate generally has a reduced dislocation or defect density level which is generally lower than a minimum-required low density range for numerous applications to a variety of advanced nitride-based compound semiconductor devices such as the laser diode and light-emitting diodes.

It is further more object of the present invention to provide a novel method of forming an epitaxially grown nitride-based compound semiconductor crystal substrate structure with such a reduced dislocation or defect density level, without using any patterned insulator mask, as generally lower than a minimum-required low density range for numerous applications to a variety of advanced nitride-based compound semiconductor devices such as the laser diode and light-emitting diodes.

It is moreover object of the present invention to provide a novel method of forming an epitaxially grown nitride-based compound semiconductor crystal substrate structure with such a reduced dislocation or defect density level, without using any micro-lithography process, as generally lower than a minimum-required low density range for numerous applications to a variety of advanced nitride-based compound semiconductor devices such as the laser diode and light-emitting diodes.

It is moreover object of the present invention to provide a novel method of forming an epitaxially grown nitride-based compound semiconductor crystal substrate structure with such a reduced dislocation or defect density level, without using any addition, complicated and/or time-consuming processes, as generally lower than a minimum-required low density range for numerous applications to a variety of advanced nitride-based compound semiconductor devices such as the laser diode and light-emitting diodes.

It is still more object of the present invention to provide a novel method of forming an epitaxially grown nitride-based compound semiconductor crystal substrate structure with such a reduced dislocation or defect density level, at a relatively high yield, a relatively low cost, and/or a relatively high re-productivity, as generally lower than a minimum-required low density range for numerous applications to a variety of advanced nitride-based compound semiconductor devices such as the laser diode and light-emitting diodes.

It is still more object of the present invention to provide a novel method of forming an epitaxially grown nitride-based compound semiconductor crystal substrate structure with such a reduced dislocation or defect density level, without using environmentally undesirable processes, for example, somewhat danger chemicals such as a fluorine acid solution and organic solvents in cleaning process, as generally lower than a minimum-required low density range for numerous applications to a variety of advanced nitride-based compound semiconductor devices such as the laser diode and light-emitting diodes.

It is another object of the present invention to provide a novel epitaxially grown nitride-based compound semiconductor crystal substrate structure free from the above problems.

It is further another object of the present invention to provide a novel epitaxially grown nitride-based compound semiconductor crystal substrate structure, wherein at least an upper region of the substrate structure has a reduced dislocation or defect density level which is generally lower than a minimum-required low density range for numerous applications to a variety of advanced nitride-based compound semiconductor devices such as the laser diode and light-emitting diodes.

It is still further another object of the present invention to provide a novel epitaxially grown single-layered nitride-based compound semiconductor crystal substrate, wherein at least an upper region of the single-layered substrate has a reduced dislocation or defect density level which is generally lower than a minimum-required low density range for numerous applications to a variety of advanced nitride-based compound semiconductor devices such as the laser diode and light-emitting diodes.

It is yet further another object of the present invention to provide a novel epitaxially grown single-layered nitride-based compound semiconductor crystal substrate, wherein an entirety of the single-layered substrate generally has a reduced dislocation or defect density level which is generally lower than a minimum-required low density range for numerous applications to a variety of advanced nitride-based compound semiconductor devices such as the laser diode and light-emitting diodes.

It is furthermore another object of the present invention to provide a novel epitaxially grown nitride-based compound semiconductor crystal substrate structure, free of any patterned insulator mask, with such a reduced dislocation or defect density level, as generally lower than a minimum-required low density range for numerous applications to a variety of advanced nitride-based compound semiconductor devices such as the laser diode and light-emitting diodes.

It is an additional object of the present invention to provide a novel nitride-based compound semiconductor device formed over an epitaxially grown nitride-based compound semiconductor crystal substrate structure free from the above problems.

It is a further additional object of the present invention to provide a novel nitride-based compound semiconductor device formed over an epitaxially grown nitride-based compound semiconductor crystal substrate structure, wherein at least an upper region of the substrate structure has a reduced dislocation or defect density level which is generally lower than a minimum-required low density range for numerous applications to a variety of advanced nitride-based compound semiconductor devices such as the laser diode and light-emitting diodes.

It is a still additional object of the present invention to provide a novel nitride-based compound semiconductor device formed over an epitaxially grown single-layered nitride-based compound semiconductor crystal substrate, wherein at least an upper region of the single-layered substrate has a reduced dislocation or defect density level which is generally lower than a minimum-required low density range for numerous applications to a variety of advanced nitride-based compound semiconductor devices such as the laser diode and light-emitting diodes.

It is yet an additional object of the present invention to provide a novel nitride-based compound semiconductor device formed over an epitaxially grown single-layered nitride-based compound semiconductor crystal substrate, wherein an entirety of the single-layered substrate generally has a reduced dislocation or defect density level which is generally lower than a minimum-required low density range for numerous applications to a variety of advanced nitride-based compound semiconductor devices such as the laser diode and light-emitting diodes.

It is still more an additional object of the present invention to provide a novel nitride-based compound semiconductor device formed over an epitaxially grown nitride-based compound semiconductor crystal substrate structure, free of any patterned insulator mask, with such a reduced dislocation or defect density level as generally lower than a minimum-required low density range for numerous applications to a variety of advanced nitride-based compound semiconductor devices such as the laser diode and light-emitting diodes.

In accordance with a primary aspect of the present invention, a metal layer is formed directly on a nitride-based compound semiconductor base layer over a substrate body, wherein the metal layer includes at least one selected from the group consisting of metals exhibiting an atomic interaction, with assistance of a heat treatment, to atoms constituting the nitride-based compound semiconductor base layer to promote removal of constitutional atoms from the nitride-based compound semiconductor base layer, whereby many pores penetrating the metal layer are formed with a generally uniform distribution, while many voids are formed in the nitride-based compound semiconductor base layer with another generally uniform distribution. Thereafter, an epitaxial growth of a nitride-based compound semiconductor crystal is made with an initial transient epitaxial growth, which fills the voids, and a subsequent main epitaxial growth over the porous metal layer.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1:
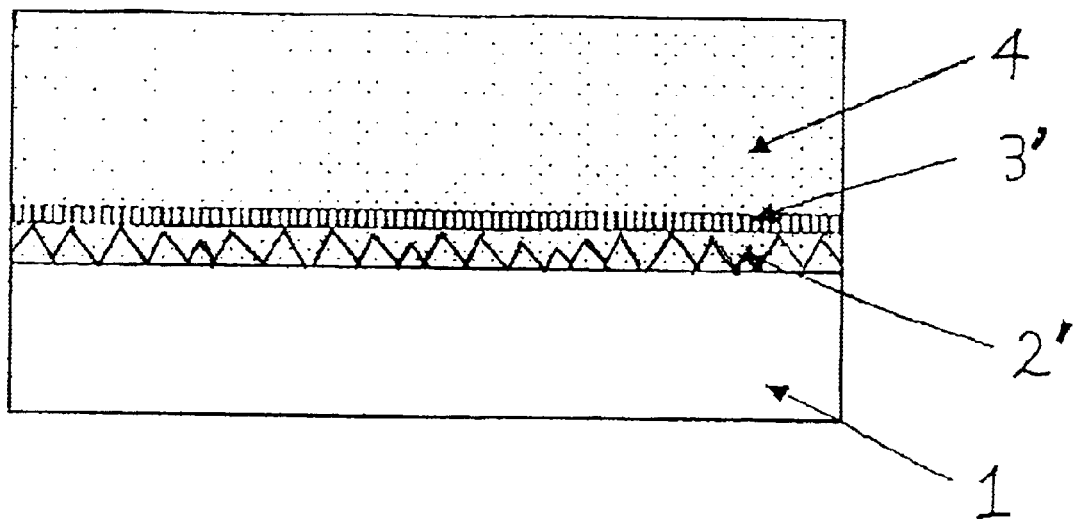
FIG. 1 is a fragmentary cross sectional elevation view of an epitaxially grown GaN substrate structure in preferred embodiments according to the present invention.

In accordance with a primary aspect of the present invention, a metal layer is formed directly on a nitride-based compound semiconductor base layer over a substrate body, wherein the metal layer includes at least one selected from the group consisting of metals exhibiting an atomic interaction, with assistance of a thermal energy, to atoms constituting the nitride-based compound semiconductor base layer to promote removal of constitutional atoms of the nitride-based compound semiconductor base layer, whereby many pores penetrating the metal layer are formed, while many voids are formed in the nitride-based compound semiconductor base layer. Thereafter, an epitaxial growth of a nitride-based compound semiconductor crystal is made, including an initial transient epitaxial growth, which fills the voids, and a subsequent main epitaxial growth over the porous metal layer. This results in an epitaxially grown nitride-based compound semiconductor crystal layer over the porous metal layer, wherein at least an upper region or an entity of the epitaxially grown nitride-based compound semiconductor crystal layer has a reduced dislocation or defect density level which is generally lower than a minimum-required low density range for numerous applications to a variety of advanced nitride-based compound semiconductor devices such as the laser diode and light-emitting diodes.

For the metal layer, one or more metals may be selected in view of the following mechanism of removal of constituting atoms of the nitride-based compound semiconductor base layer. It is important for causing removal of constituting atoms of the nitride-based compound semiconductor base layer to form the voids in the nitride-based compound semiconductor base layer that the metal is capable of taking nitrogen atoms thereunto from the nitride-based compound semiconductor base layer in assistance with a thermal energy supplied, thereby to form metal nitride in the metal layer.

If metal nitride of the metal layer has a lower free energy than the free energy of the nitride-based compound semiconductor base layer, then this implies that the metal in the metal layer generally tends to take nitrogen atoms thereunto from the nitride-based compound semiconductor base layer in assistance with a thermal energy supplied, so that remaining one or more elements of the nitride-based compound semiconductor base layer become unstable and are generally likely to be eliminated from the surface of the nitride-based compound semiconductor base layer. This results in formations of the voids.

In contrast to the present invention, however, if metal nitride of the metal layer has a higher free energy than the free energy of the nitride-based compound semiconductor base layer, then this implies that the metal in the metal layer is generally incapable of taking nitrogen atoms thereunto from the nitride-based compound semiconductor base layer in assistance with a thermal energy supplied.

Accordingly, in accordance with the present invention, the metal for the metal layer should be selected in connection with the nitride-based compound semiconductor of the base layer, such that a nitride of the selected metal has a lower free energy than the free energy of the nitride-based compound semiconductor base layer. This implies that such the selected at least one metal exhibits an atomic interaction, with assistance of a thermal energy, to atoms constituting the nitride-based compound semiconductor base layer and the selected at least one metal is likely to take nitrogen atoms from the nitride-based compound semiconductor base layer and to promote removal of constitutional atoms of the nitride-based compound semiconductor base layer, whereby many pores penetrating the metal layer are formed, while many voids are formed in the nitride-based compound semiconductor base layer.

In accordance with the present invention, there is also important the epitaxial growth of the nitride-based compound semiconductor crystal in combination with the above process for forming the pores penetrating the metal layer and the voids in the nitride-based compound semiconductor base layer. The epitaxial growth of the nitride-based compound semiconductor crystal includes an initial transient epitaxial growth process for filling the voids with the nitride-based compound semiconductor crystal and a subsequent main epitaxial growth process for growing the nitride-based compound semiconductor crystal over the metal layer.

In the initial transient epitaxial growth process, source materials of the nitride-based compound semiconductor crystal are supplied through the pores which penetrate the nitride metal layer into the voids, so that the epitaxial growth is caused or initiated from the surfaces of the voids, whereby the voids are completely filled with the nitride-based compound semiconductor crystal which has a lower dislocation density than a dislocation density of the nitride-based compound semiconductor base layer due to change in direction of the propagation of the dislocation. Further, the porous metal nitride layer may contribute to block or discontinue further propagation in upward direction of the dislocations from the nitride-based compound semiconductor base layer.

After the voids have been completely filled with the nitride-based compound semiconductor crystal by the initial transient epitaxial growth process, then the initial transient epitaxial growth process is continuously subsequent to the main epitaxial growth process, wherein the pores of the porous metal nitride layer are completely filled with the nitride-based compound semiconductor crystal, and further micro-projections from the pores of the porous metal nitride layer are formed.

Those micro-projections have generally triangle sectioned shape such as generally isosceles triangle sectioned shape, of the nitride-based compound semiconductor crystal which is lower in the dislocation density than the nitride-based compound semiconductor base layer due to the change in direction of the propagation of the dislocation as well as blocks or discontinuation by the metal nitride layer to further propagation in upward direction of the dislocations into or through the micro-projections of the nitride-based compound semiconductor crystal.

The main epitaxial growth process further continues growth of the micro-projections of the nitride-based compound semiconductor crystal, so that adjacent micro-projections will become united with each other during the continuous epitaxial growth, whereby the directions of the propagation of the dislocations are changed, and the dislocations propagated generally in the upward direction has a further lower dislocation density than the nitride-based compound semiconductor crystal which fills the voids.

The main epitaxial growth process will result in the formation, over the porous metal nitride layer, of the epitaxially grown nitride-based compound semiconductor crystal layer with an upper region or a surface region which has a lower dislocation density than the dislocation density of the micro-projections, because what will reach the upper region or the surface region are the dislocations propagated generally in the upward direction with a further in average lower dislocation density than the filling nitride-based compound semiconductor crystal which fills the voids. As described above, the micro-projections are further in average lower in dislocation density than the filling nitride-based compound semiconductor crystal which fills the voids, which is further in average lower than the nitride-based compound semiconductor base layer.

Accordingly, the upper region or the surface region of the epitaxially grown nitride-based compound semiconductor crystal layer over the porous metal nitride layer has a much lower dislocation density in average than the nitride-based compound semiconductor base layer. The semiconductor device such as the laser diode or the light emitting diode is formed over the upper region or the surface region of the epitaxially grown nitride-based compound semiconductor crystal layer. The much lower dislocation density of the upper region or the surface region of the epitaxially grown nitride-based compound semiconductor crystal layer allows an advanced semiconductor device on the upper region or the surface region to exhibit improved high performances with a high reliance.

Since the sufficiently low dislocation density of the upper region or the surface region of the epitaxially grown nitride-based compound semiconductor crystal layer over the metal layer is important for the semiconductor device formed thereon, it is optionally possible to remove the metal layer and the nitride-based compound semiconductor base layer with an underlying substrate body, over which the nitride-based compound semiconductor base layer is formed, thereby to obtain a single-layered epitaxially grown nitride-based compound semiconductor crystal substrate which simply comprises the above-described epitaxially grown nitride-based compound semiconductor crystal layer.

It will be apparent to persons skilled in the art that the nitride-based compound semiconductor base layer may be formed over any available crystal substrate body which supports the nitride-based compound semiconductor base layer. The substrate body may, for example, be a sapphire substrate or any other glass substrate with or without a buffer layer interposed between the nitride-based compound semiconductor base layer and the crystal substrate body. The interposing buffer layer is to relax a stress of the nitride-based compound semiconductor base layer due to a difference in lattice constant between the nitride-based compound semiconductor base layer and the crystal substrate body.

It will be apparent to persons skilled in the art that the above epitaxial growth may be carried out by use of preferred one of any available growth methods such as a metal organic chemical vapor deposition, a molecular beam epitaxy and a hydride vapor phase epitaxy.

In preferred embodiments, it was found by the present inventors that the heat treatment for forming the pores penetrating the metal film and also forming the voids in the nitride-based compound semiconductor base layer may advantageously be carried out in the presence of a hydrogen-containing atmosphere, wherein hydrogen included in the atmosphere generally promotes the formation of the voids in the nitride-based compound semiconductor base layer. One of the typical nitride-based compound semiconductors is gallium nitride. In this case, hydrogen included in the atmosphere also promotes the formation of the voids in the nitride-based compound semiconductor base layer.

In other preferred embodiments, it was also found by the present inventors that nitration of the metal layer favors or assists the epitaxial growth of the nitride-based compound semiconductor crystal over the metal nitride layer. One of the typical nitride-based compound semiconductors is gallium nitride, and one of the typical metal layer is a titanium-containing layer. In this case, nitration of the titanium-containing layer is preferable for the epitaxial growth of the gallium nitride crystal over the titanium nitride based metal layer. The nitration of the metal layer may automatically be carried out by exposing the metal layer to a nitrogen-containing atmosphere for the epitaxial growth of the nitride-based compound semiconductor crystal over the metal nitride layer with supply of a thermal energy, for example, during the heat treatment. In order to improve the re-productivity of the desirable epitaxial growth of the nitride-based compound semiconductor crystal over the metal nitride layer, it is preferable that a nitrogen gas is added into the atmosphere with control of nitrogen content level in the atmosphere for further promotion of the nitration of the metal layer with supply of a thermal energy, for example, during the heat treatment. As described above, the at least one metal is selected for the metal layer in view that the at least one metal is capable of taking nitrogen atoms thereunto from the nitride-based compound semiconductor base layer with assistance of the thermal energy as supplied, for example, with the heat treatment, in order to form the voids in the nitride-based compound semiconductor base layer. This also results in further promotion of nitration of the metal layer. In view of the promotion of the voids in combination with the other promotion to the nitration of the metal layer, it is, therefore, more preferable that the atmosphere are added with not only a hydrogen gas or hydrogen atoms which promotes the formation of the voids but also a nitrogen gas or nitrogen atoms.

The pores should be pores which penetrate the metal layer for allowing supply of the epitaxial growth source gas through the penetrating pores into the voids. It is preferable that a thickness of the metal layer is decided in consideration of the possibility of forming the pores which penetrate the metal layer. If a thickness of the metal layer is extensively thick, this makes it difficult to form pores which penetrate the metal layer. As described above, the selected at lest one metal is capable of taking nitrogen atoms from the nitride-based compound semiconductor base layer with assistance of the thermal energy as supplied by the heat treatment. The kinds of the selectable metals are restricted. The typical upper limit of the preferable thickness range for the metal layer is approximately less than the micron-order. If the metal layer is a titanium-containing metal layer, the critical thickness may be approximately 500 nanometers for allowing formations of the pores with generally uniform distribution over the metal layer. Namely, the thickness of the titanium-containing metal layer is preferably not more than approximately 500 nanometers. As described above, this metal layer is nitrated with the supply of thermal energy and by exposing the metal layer to the nitrogen-containing atmosphere and also the above-described phenomenon that the selected metal takes nitrogen atoms from the nitride-based compound semiconductor base layer. The above typical critical value of the thickness is for the thickness of the unnitrated metal layer before the nitration reaction, while the thickness of the metal nitride layer may often be larger than the thickness of the unnitrated metal layer.

If the thickness of the metal layer is larger than the critical upper limit of the available thickness range, then this makes it difficult to form small or fine pores which penetrate the metal layer, resulting in difficulty of the initial transient epitaxial growth of filling the voids with the nitride-based compound semiconductor crystal. Further, the larger thickness than the critical upper limit may generally cause deterioration in the planarity of the metal layer surface, resulting in generation of defects or dislocation in the epitaxially grown nitride-based compound semiconductor crystal over the metal layer, or in bad case, prevention to the epitaxial growth over the metal.

A generally uniform distribution of fine pores over the metal layer is preferable, and ideally, an averaged diameter of the pores and an averaged distance between adjacent twos of the pores may more preferably be in the order of 0.1 micron, provided that these preferable averaged diameter and distance of the pores are generally be likely depend on the boundary conditions for the effect of the reduction in the dislocation density of the epitaxially grown nitride-based compound semiconductor crystal over the metal layer, wherein the boundary conditions further depend on combinations of the thickness of the nitride-based compound semiconductor base layer, the thickness of the metal layer, the metal material for the metal layer, the heat treatment conditions, the epitaxial growth conditions for epitaxially growing the nitride-based compound semiconductor crystal over the metal layer.

A generally uniform distribution of the voids over the metal layer is preferable for obtaining a generally uniform dislocation density over the epitaxially grown nitride-based compound semiconductor. This will be apparent to persons skilled in the art from the above descriptions of the mechanism of reduction in the dislocation density of the epitaxially grown nitride-based compound semiconductor crystal over the metal layer. The shape of each the voids is likely to depend on the crystal structure, but the size of the voids depends on the various process conditions. The control in size of the voids may also be preferable in view of the effective reduction in the dislocation density of the epitaxially grown nitride-based compound semiconductor crystal which fills the voids. It is preferable that an averaged depth of the voids is generally not less than approximately 10 nanometers. If the averaged depth of the voids is much shallower than approximately 10 nanometers, dislocations may generally appear in the void-filling nitride-based compound semiconductor crystal within the voids, resulting in an inefficient or ineffective reduction of the dislocation density of the epitaxially grown nitride-based compound semiconductor crystal over the metal layer.

The efficiency or the effect of reduction of the dislocation density of the epitaxially grown nitride-based compound semiconductor crystal over the metal layer is further likely to depend on a porosity rate of the void-formed surface of the nitride-based compound semiconductor base layer in addition to the factors described above. Increasing the porosity rate is likely to increase the efficiency of reduction in the dislocation density of the epitaxially grown nitride-based compound semiconductor crystal over the metal layer. An excessively low porosity rate results in insufficient reduction in the dislocation density of the epitaxially grown nitride-based compound semiconductor crystal over the metal layer. An excessively low porosity rate results in a possibility of peeling the metal layer from the void-formed surface of the nitride-based compound semiconductor base layer. A typical and preferable range of the porosity rate may be in the range of 10% to 90%.

As described above, the mechanism for forming the voids in the nitride-based compound semiconductor base layer is that the selected at least one metal of the metal layer is likely to take nitrogen atoms from the nitride-based compound semiconductor base layer, with assistance of a thermal energy supplied by the heat treatment, on the ground that the free energy of the nitride of the selected at least one metal of the metal layer is lower than the free energy of the nitride-based compound semiconductor base layer. The minimum thermal energy level necessary for allowing the selected at least one metal of the metal layer to take nitrogen atoms from the nitride-based compound semiconductor base layer would depend on combinations of one or more constituting elements for the metal layer and constituting elements for the nitride-based compound semiconductor base layer. In general, a larger thermal energy or a higher temperature treat treatment is likely to be preferable. Typical and preferable temperature of the heat treatment is at least approximately 700° C. Decreasing the temperature from 700° C. decreases the efficiency of the atomic decomposition of the nitride-based compound semiconductor, or the efficiency that the selected at least one metal of the metal layer does take nitrogen atoms from the nitride-based compound semiconductor base layer. This results in an inefficient formation of the voids.

After the heat treatment for forming the pores in the metal layer and the voids in the nitride-based compound semiconductor base layer is carried out under the above-described atmospheric and temperature preferable conditions, then the epitaxial growth for filling the voids and growing the nitride-based compound semiconductor crystal over the metal layer is carried out. It is preferable that the heat treatment and subsequent the epitaxial growth are carried out in the same reaction chamber sequentially without exposure to an open atmosphere, in order to keep the surface of the substrate in clean and obtain the desirable epitaxial growth at high purity with less formation of crystal defects or dislocations in the epitaxially grown nitride-based compound semiconductor crystal over the metal layer.

The mechanism for reducing the dislocation density of the epitaxially grown nitride-based compound semiconductor crystal layer is as described above in detail. The above-described mechanism is, of course, applicable to a variety of nitride-based compound semiconductors, typically, gallium-nitride based compound semiconductors such as gallium nitride. In accordance with the above-described dislocation density reduction mechanism, the dislocation density of the upper region or the upper surface of the epitaxially grown nitride-based compound semiconductor crystal layer over the metal layer generally may be, in the average, reduced to at most approximately the order of 1E8 $cm^{-2}$. Typically, the dislocation density of the upper region or the upper surface of the epitaxially grown gallium-nitride based compound semiconductor crystal layer over the metal layer may be reduced to at most approximately 1E8 $cm^{-2}$.

In view of the reduction in the dislocation density of the epitaxially grown nitride-based compound semiconductor crystal, it is preferable that the epitaxial growth from the void-formed surface of the nitride-based compound semiconductor base layer is made in the presence of the metal layer, because the metal layer blocks a majority of propagations in the generally upward direction of the dislocations from the nitride-based compound semiconductor base layer. Notwithstanding, the pores penetrating the metal layer allows a minority of the dislocations to further propagate to the micro-projections from the pores over the metal layer. However, the above-described mechanism in connection with the reduction of the dislocation density prevents or controls further more propagations of the dislocations in the generally upward direction, resulting in the desirable low dislocation density of the epitaxially grown nitride-based compound semiconductor crystal over the metal layer.

In contrast to the present invention, if the epitaxial growth from the void-formed surface of the nitride-based compound semiconductor base layer is made in the absence of the metal layer, then this allows a minority of the dislocations to further propagate to the epitaxially grown nitride-based compound semiconductor crystal, resulting in an insufficient reduction of the dislocation density.

In contrast also to the present invention, if no voids are formed and the epitaxial growth from a void-free surface of the nitride-based compound semiconductor base layer is made in the presence of the metal layer, then this does not utilize the above-described mechanism for reduction in the dislocation density by the initial transient epitaxial growth in the voids, resulting also in an insufficient reduction of the dislocation density. The epitaxial growth of a gallium nitride layer from the void-free surface of a gallium nitride base layer in the presence of a titanium nitride film overlying the void-free surface results in insufficient reduction of the dislocation density. This epitaxial growth is undesirable in view of reduction of the dislocation density because this epitaxial growth is not intended to reduce the dislocation density. The undesirable epitaxial growth of a gallium nitride layer from the void-free surface of a gallium nitride base layer in the presence of a titanium nitride film overlying the void-free surface is disclosed in Japanese laid-open patent publications Nos. 10-321954 and 11-260835 which are incorporated herein as references.

Accordingly, the above-described combined presence of both the voids and the metal layer in the epitaxial growth according to the present invention is important for obtaining the desirably low dislocation density of the epitaxially grown nitride-based compound semiconductor crystal.

It is preferable that for the crystal perfection of the upper region or the upper surface of the epitaxially grown nitride-based compound semiconductor crystal over the metal layer, a fall width at half maximum of a (0002)-diffraction rocking curve and another full width at half maximum of a (10—10)-diffraction rocking curve are both at most 0.1 degree. The measurement to the full width at half maximum of the diffraction rocking curve may optionally be made by using any available X-ray, for example, a Cu$k\alpha_1$ single-color X-ray with a quad-crystal monochrome. The full width at half maximum of the (0002)-diffraction rocking curve and the other full width at half maximum of the (10—10)-diffraction rocking curve correspond, respectively, to a tilted angle and a twisted angle of the crystal grains in the upper region or the upper surface of the epitaxially grown nitride-based compound semiconductor crystal. For the epitaxially grown gallium nitride crystal over the sapphire substrate according to the conventional growth method without forming the voids and in the absence of the metal layer, the twisted angle is normally not less than 0.1 degree, and the dislocation density of the epitaxially grown gallium nitride crystal is above 1E8 cm$^{-2}$. If both of the full width at half maximum of the (0002)-diffraction rocking curve and the other full width at half maximum of the (10—10)-diffraction rocking curve are not more than 0.1 degree, then this implies that the dislocation density of the epitaxially grown gallium nitride crystal is not more than 1E8 cm$^{-2}$.

It is preferable for applications to the substrate for a variety of the semiconductor devices that the epitaxially grown gallium nitride crystal obtained in accordance with the present invention has a high surface planarity over a relatively wide area or in a long length order which is larger than the device length of the applied semiconductor device. The surface planarity provides an influence to the efficiency of picking up an emitted light from the laser diode through the substrate. For application to the gallium nitride compound semiconductor laser diode, it is preferable for obtaining a relatively high surface planarity that the surface planarity of the epitaxially grown gallium nitride crystal is within approximately ±0.2 micrometers with reference to a reference plane in a length order of approximately 500 micrometers.

In a preferred embodiment, the surface region of the epitaxially grown nitride-based compound semiconductor crystal over the metal layer has a C-plane. In order to form such C-plane, it is preferable that the nitride-based compound semiconductor base layer has a surface generally oriented to [0001], and the metal layer has a hexagonal crystal structure generally oriented to [0001], or that the nitride-based compound semiconductor base layer has a surface generally oriented to [0001], and the metal layer has a cubic crystal structure generally oriented to [111]. For example, if the nitride-based compound semiconductor base layer is formed over a crystal supporting substrate, then it is preferable that the crystal supporting substrate has a crystal structure generally oriented to [0001] with an off-angle of at most 0.1 degree, and more preferably just oriented to [0001] with zero off-angle.

In a preferred embodiment, it will be apparent to a person skilled in the art that the above-described substrate structure may optionally be formed over a crystal supporting substrate such as a sapphire substrate. Namely, the nitride-based compound semiconductor base layer is formed over the crystal supporting substrate such as a sapphire substrate. Further, one or more buffer layers may optionally be interposed between the crystal supporting substrate and the above-described substrate structure. Namely, the nitride-based compound semiconductor base layer is formed on the one or more buffer layers over the crystal supporting substrate such as a sapphire substrate.

For the above-described substrate structure in accordance with the present invention, the epitaxially grown nitride-based compound semiconductor crystal over the metal layer is used for formation of the semiconductor device. This means that after the epitaxially grown nitride-based compound semiconductor crystal with the reduced dislocation density has been obtained, then the metal layer and other underlying structure under the metal layer are not necessarily needed for forming the semiconductor device. It is, therefore, possible that after the epitaxially grown nitride-based compound semiconductor crystal has been formed over the metal layer, then the crystal supporting substrate, the nitride-based compound semiconductor base layer and the metal layer may optionally be removed to form a single layered substrate structure of the epitaxially grown nitride-based compound semiconductor crystal. Known techniques such as etching to persons skilled in the art may advantageously be used for the method of removing those layers.

In a preferred embodiment, in view of further reduction to the dislocation density of the epitaxially grown nitride-based compound semiconductor crystal, it is effective to utilize a dielectric mask pattern in the epitaxial growth. The bottom surface of the dielectric mask pattern contributes to block further propagation in generally upward direction of the dislocation. Further, gaps of the dielectric mask pattern allow epitaxial growth through them, wherein small projections of the epitaxially grown nitride-based compound semiconductor crystal are formed within the gaps, before the epitaxial growth is further continued in not only vertical but lateral directions over the dielectric mask pattern. The projections of the epitaxially grown nitride-based compound semiconductor crystal are then grown up and adjacent ones thereof become united with each other, followed by the main epitaxial growth in the generally upward direction.

Propagation of a majority of the dislocations is blocked and terminated by the bottom surface of the dielectric mask pattern, while propagation of a minority of the dislocations is allowed by the gaps of the dielectric mask pattern. The minority of the dislocations are propagated to the projections, wherein a change in the propagation direction of a large part of these propagating dislocation from the generally vertical direction to the generally horizontal direction will appear. This change reduces the number of the dislocations propagating in the generally vertical direction. Further, when the adjacent projections of the epitaxially grown nitride-based compound semiconductor crystal become united with each other, a further change in the propagation direction of the dislocations from the generally horizontal direction to the generally vertical direction will appear. This change allows a part of the horizontally propagating dislocations to be changed in the propagation direction generally upwardly. In consequence, the density of the dislocations propagating in the generally vertical direction over the dielectric mask pattern is much lower than the density of the dislocations propagating in the generally vertical direction under the dielectric mask pattern. These are the mechanism for reducing the dislocation density by the dielectric mask pattern.

In order to further reduce the dislocation density, this dielectric mask pattern may preferably be thick relatively with reference to the gap size, to provide such an additional effect that the most of the horizontally propagating dislocations are blocked or terminated by the side walls of the gaps of the dielectric mask pattern in addition to the above-described basic effects or functions by the dielectric mask pattern.

The technique using the dielectric mask pattern for reduction in the dislocation density of the nitride-base compound semiconductor crystal is disclosed in U.S. patent application Ser. No. 10/091,437, which is incorporated herein as a reference for enabling a person skilled in the art to practice or use these technique in combination with the above-described present invention.

In one preferred embodiment, the dielectric mask pattern may be formed over the crystal supporting substrate before epitaxially growing the nitride-based compound semiconductor base layer over said dielectric mask pattern, whereby the dislocation density of the nitride-based compound semiconductor base layer is reduced by the above-described mechanism. Thereafter, the metal layer is formed on the nitride-based compound semiconductor base layer. According to the above-described present invention, the heat treatment is then carried out to form the pores in the metal layer and the voids in the nitride-based compound semiconductor base layer, followed by the initial transient epitaxial growth filling the voids and the subsequent main epitaxial growth.

For this substrate structure including both the dielectric mask pattern and the metal layer for reduction to the dislocation density in accordance with the present invention, the epitaxially grown nitride-based compound semiconductor crystal over the metal layer is used for formation of the semiconductor device. This means that after the epitaxially grown nitride-based compound semiconductor crystal with the reduced dislocation density has been obtained, then the dielectric mask pattern, the metal layer and other underlying structure under the metal layer are not necessarily needed for forming the semiconductor device. It is, therefore, possible that after the epitaxially grown nitride-based compound semiconductor crystal has been formed over the metal layer, then the crystal supporting substrate, the dielectric mask pattern, the nitride-based compound semiconductor base layer and the metal layer may optionally be removed to form a single layered substrate structure of the epitaxially grown nitride-based compound semiconductor crystal. Known techniques such as etching to persons skilled in the art may advantageously be used for the method of removing those layers.

In another preferred embodiment, the dielectric mask pattern may be formed over the epitaxially grown nitride-based compound semiconductor crystal over the metal layer, for further epitaxially growing an additional nitride-based compound semiconductor top layer over the dielectric mask pattern, whereby the dislocation density of the additional nitride-based compound semiconductor top layer is lower than the dislocation density of the epitaxially grown nitride-based compound semiconductor crystal over the metal layer.

For this substrate structure including both the dielectric mask pattern and the metal layer for reduction to the dislocation density in accordance with the present invention, the additional nitride-based compound semiconductor top layer over the dielectric mask pattern is used for formation of the semiconductor device. This means that after the additional nitride-based compound semiconductor top layer with the reduced dislocation density has been obtained, then the dielectric mask pattern, the epitaxially grown nitride-based compound semiconductor crystal, the metal layer and other underlying structure under the metal layer are not necessarily needed for forming the semiconductor device. It is, therefore, possible that after the epitaxially grown nitride-based compound semiconductor crystal has been formed over the metal layer, then the crystal supporting substrate, the nitride-based compound semiconductor base layer, the metal layer, the epitaxially grown nitride-based compound semiconductor crystal, and the dielectric mask pattern may optionally be removed to form a single layered substrate structure of the additional nitride-based compound semiconductor top layer. Known techniques such as etching to persons skilled in the art may advantageously be used for the method of removing those layers.

The shape and size of the dielectric mask pattern may advantageously be decided in accordance with the empirical knowledge of the person skilled in the art, if any, in view of the disclosures in U.S. patent application Ser. No. 10/091, 437 as referred above.

Throughout the specification with claims, the term "nitride-based compound semiconductor" means to include any kinds of the undoped or doped compound semiconductor which contains or includes nitrogen, typically gallium nitride based compound semiconductors, for example, gallium nitride, aluminum gallium nitride and gallium indium nitride.

In still another preferred embodiment, it will be apparent to a person skilled in the art that some of the alloys may be useable for the metal layer. Thus, the above metal layer may be made of an advantageously selected alloy, provided that a nitride of the selected alloy has a lower free energy than the nitride-based compound semiconductor on the grounds described above in detail.

Furthermore, it is preferable to utilize a surfactant effect for epitaxial growth over the metal layer with a reduced defect or dislocation density of the epitaxially grown nitride-based compound semiconductor crystal over the metal layer. For example, an advantageously selected one or more element which is capable of exhibiting a surfactant effect is absorbed onto the surface of the metal layer for subsequent epitaxial growth over the metal layer of the nitride-based compound semiconductor crystal, thereby reducing the defect or dislocation density of the epitaxially grown nitride-based compound semiconductor crystal over the metal layer.

In accordance with the above detailed descriptions of the present invention, it will be apparent to person skilled in the art that the present invention provides the following advantageous methods and substrate structures.

Accordingly, the present invention provides a novel method of forming an epitaxially grown nitride-based compound semiconductor crystal substrate structure free from the above problems.

The present invention also provides a novel method of forming an epitaxially grown nitride-based compound semiconductor crystal substrate structure, wherein at least an upper region of the substrate structure has a reduced dislocation or defect density level which is generally lower than a minimum-required low density range for numerous applications to a variety of advanced nitride-based compound semiconductor devices such as the laser diode and light-emitting diodes.

The present invention also provides a novel method of forming an epitaxially grown single-layered nitride-based compound semiconductor crystal substrate, wherein at least an upper region of the single-layered substrate has a reduced dislocation or defect density level which is generally lower than a minimum-required low density range for numerous applications to a variety of advanced nitride-based compound semiconductor devices such as the laser diode and light-emitting diodes.

The present invention also provides a novel method of forming an epitaxially grown single-layered nitride-based compound semiconductor crystal substrate, wherein an entirety of the single-layered substrate generally has a reduced dislocation or defect density level which is generally lower than a minimum-required low density range for numerous applications to a variety of advanced nitride-based compound semiconductor devices such as the laser diode and light-emitting diodes.

The present invention also provides a novel method of forming an epitaxially grown nitride-based compound semiconductor crystal substrate structure with such a reduced dislocation or defect density level, without using any patterned insulator mask, as generally lower than a minimum-required low density range for numerous applications to a variety of advanced nitride-based compound semiconductor devices such as the laser diode and light-emitting diodes.

The present invention also provides a novel method of forming an epitaxially grown nitride-based compound semiconductor crystal substrate structure with such a reduced dislocation or defect density level, without using any microlithography process, as generally lower than a minimum-required low density range for numerous applications to a variety of advanced nitride-based compound semiconductor devices such as the laser diode and light-emitting diodes.

The present invention also provides a novel method of forming an epitaxially grown nitride-based compound semiconductor crystal substrate structure with such a reduced dislocation or defect density level, without using any addition, complicated and/or time-consuming processes, as generally lower than a minimum-required low density range for numerous applications to a variety of advanced nitride-based compound semiconductor devices such as the laser diode and light-emitting diodes.

The present invention also provides a novel method of forming an epitaxially grown nitride-based compound semiconductor crystal substrate structure with such a reduced dislocation or defect density level, at a relatively high yield, a relatively low cost, and/or a relatively high re-productivity, as generally lower than a minimum-required low density range for numerous applications to a variety of advanced nitride-based compound semiconductor devices such as the laser diode and light-emitting diodes.

The present invention also provides a novel method of forming an epitaxially grown nitride-based compound semiconductor crystal substrate structure with such a reduced dislocation or defect density level, without using environmentally undesirable processes, for example, somewhat danger chemicals such as a fluorine acid solution and organic solvents in cleaning process, as generally lower than a minimum-required low density range for numerous applications to a variety of advanced nitride-based compound semiconductor devices such as the laser diode and light-emitting diodes.

The present invention also provides a novel epitaxially grown nitride based compound semiconductor crystal substrate structure free from the above problems.

The present invention also provides a novel epitaxially grown nitride-based compound semiconductor crystal substrate structure, wherein at least an upper region of the substrate structure has a reduced dislocation or defect density level which is generally lower than a minimum-required low density range for numerous applications to a variety of advanced nitride based compound semiconductor devices such as the laser diode and light-emitting diodes.

The present invention also provides a novel epitaxially grown single-layered nitride-based compound semiconductor crystal substrate, wherein at least an upper region of the single-layered substrate has a reduced dislocation or defect density level which is generally lower than a minimum-required low density range for numerous applications to a variety of advanced nitride-based compound semiconductor devices such as the laser diode and light-emitting diodes.

The present invention also provides a novel epitaxially grown single-layered nitride-based compound semiconductor crystal substrate, wherein an entirety of the single-layered substrate generally has a reduced dislocation or defect density level which is generally lower than a minimum-required low density range for numerous applications to a variety of advanced nitride-based compound semiconductor devices such as the laser diode and light-emitting diodes.

The present invention also provides a novel epitaxially grown nitride-based compound semiconductor crystal substrate structure, free of any patterned insulator mask, with such a reduced dislocation or defect density level, as generally lower than a minimum-required low density range for numerous applications to a variety of advanced nitride-based compound semiconductor devices such as the laser diode and light-emitting diodes.

The present invention also provides a novel nitride-based compound semiconductor device formed over an epitaxially grown nitride-based compound semiconductor crystal substrate structure free from the above problems.

The present invention also provides provide a novel nitride-based compound semiconductor device formed over an epitaxially grown nitride-based compound semiconductor crystal substrate structure, wherein at least an upper region of the substrate structure has a reduced dislocation or defect density level which is generally lower than a minimum-required low density range for numerous applications to a variety of advanced nitride-based compound semiconductor devices such as the laser diode and light-emitting diodes.

The present invention also provides a novel nitride-based compound semiconductor device formed over an epitaxially grown single-layered nitride-based compound semiconductor crystal substrate, wherein at least an upper region of the single-layered substrate has a reduced dislocation or defect density level which is generally lower than a minimum-required low density range for numerous applications to a variety of advanced nitride-based compound semiconductor devices such as the laser diode and light-emitting diodes.

The present invention also provides a novel nitride-based compound semiconductor device formed over an epitaxially grown single-layered nitride-based compound semiconductor crystal substrate, wherein an entirety of the single-layered substrate generally has a reduced dislocation or defect density level which is generally lower than a minimum-required low density range for numerous applications to a variety of advanced nitride-based compound semiconductor devices such as the laser diode and light-emitting diodes.

The present invention also provides a novel nitride-based compound semiconductor device formed over an epitaxially grown nitride-based compound semiconductor crystal substrate structure, free of any patterned insulator mask, with such a reduced dislocation or defect density level as generally lower than a minimum-required low density range for numerous applications to a variety of advanced nitride-based compound semiconductor devices such as the laser diode and light-emitting diodes.

EXAMPLE 1

Figure 3:
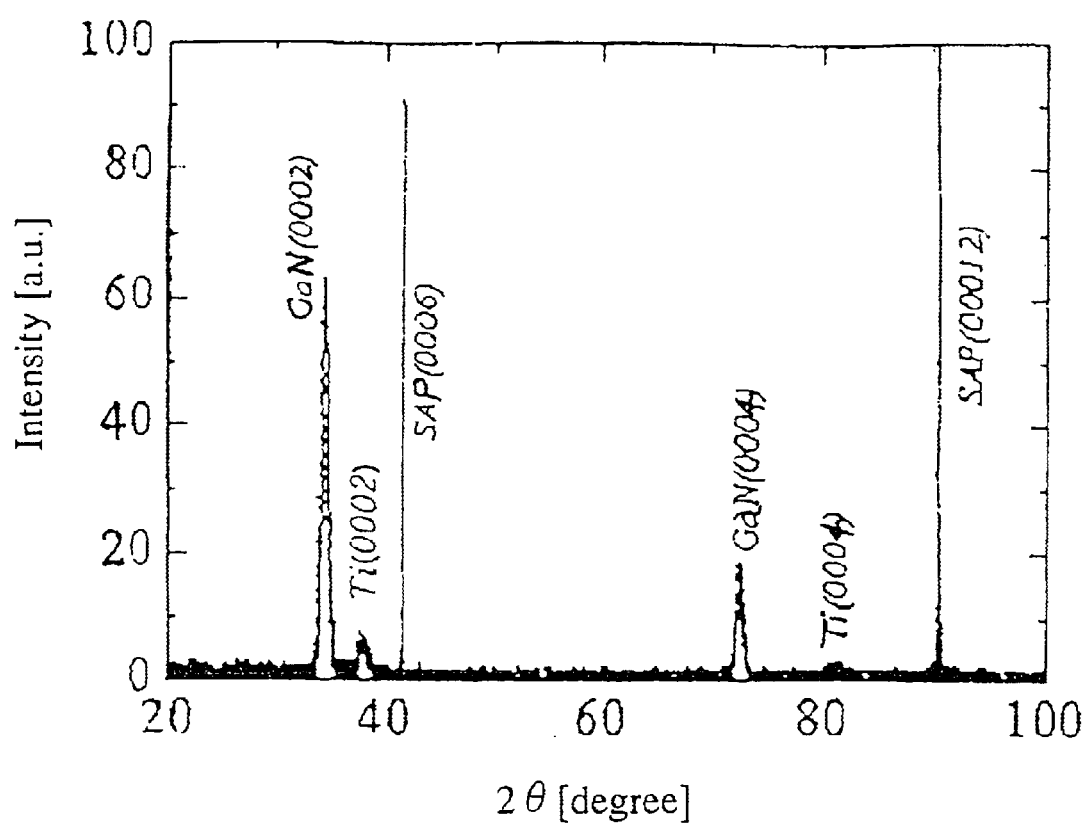
FIG. 3 is a diagram showing a result of an X-ray diffraction measurement of a substrate with a deposited titanium metal layer which is not heat-treated in one step involved in a novel method for forming an epitaxially grown GaN substrate structure in preferred embodiments according to the present invention.

A single crystal sapphire substrate was prepared, which has a diameter of 2 inches and a surface with C-plane. An undoped epitaxial GaN layer with a thickness of 400 nanometers was deposited on the C-plane of the single crystal sapphire substrate by MOCVD using trimethyl gallium (TMG) and $NH_3$ as source gases. A titanium film with a thickness of 20 nanometers was formed by evaporation on the undoped epitaxial GaN layer. The substrate was subjected to an X-ray diffraction measurement, a result of which is shown in FIG. 3. It was observed that the titanium film has a crystal orientation to [0001].

Figure 4:
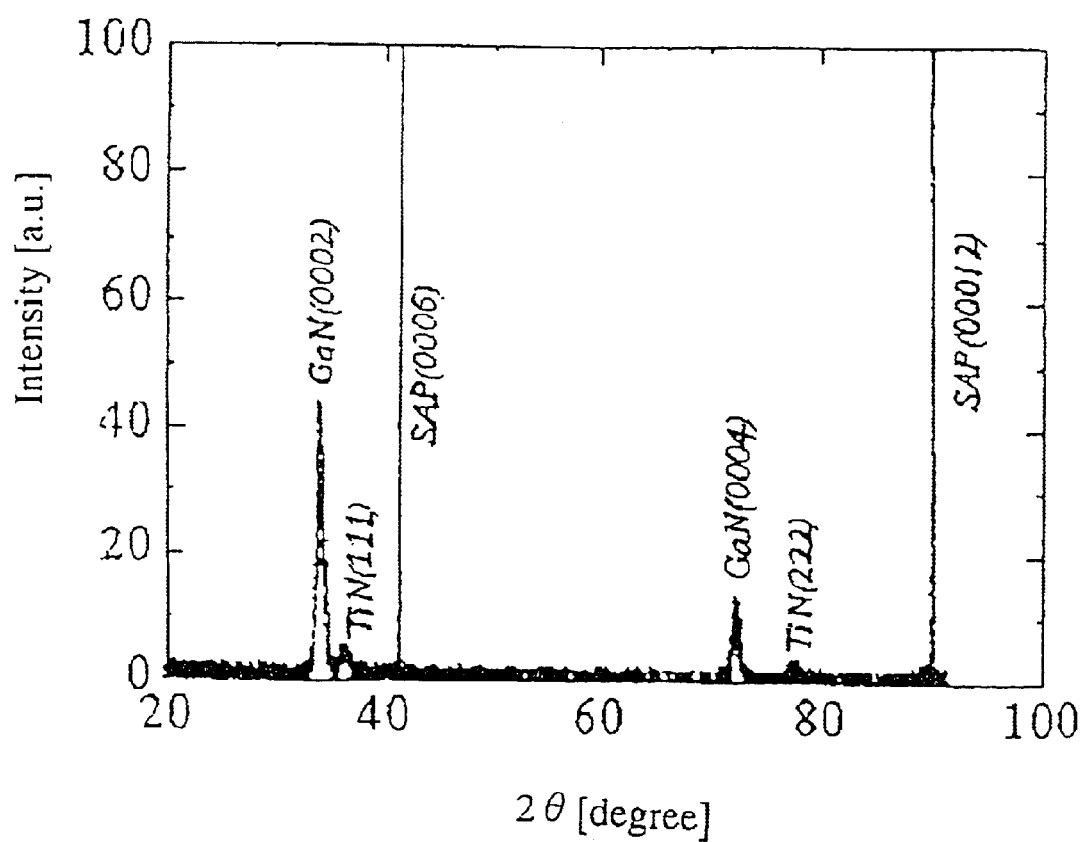
FIG. 4 is a diagram showing a result of an X-ray diffraction measurement of a substrate with a deposited titanium metal layer which is heat-treated in another step involved in a novel method for forming an epitaxially grown GaN substrate structure in preferred embodiments according to the present invention.
Figure 5:
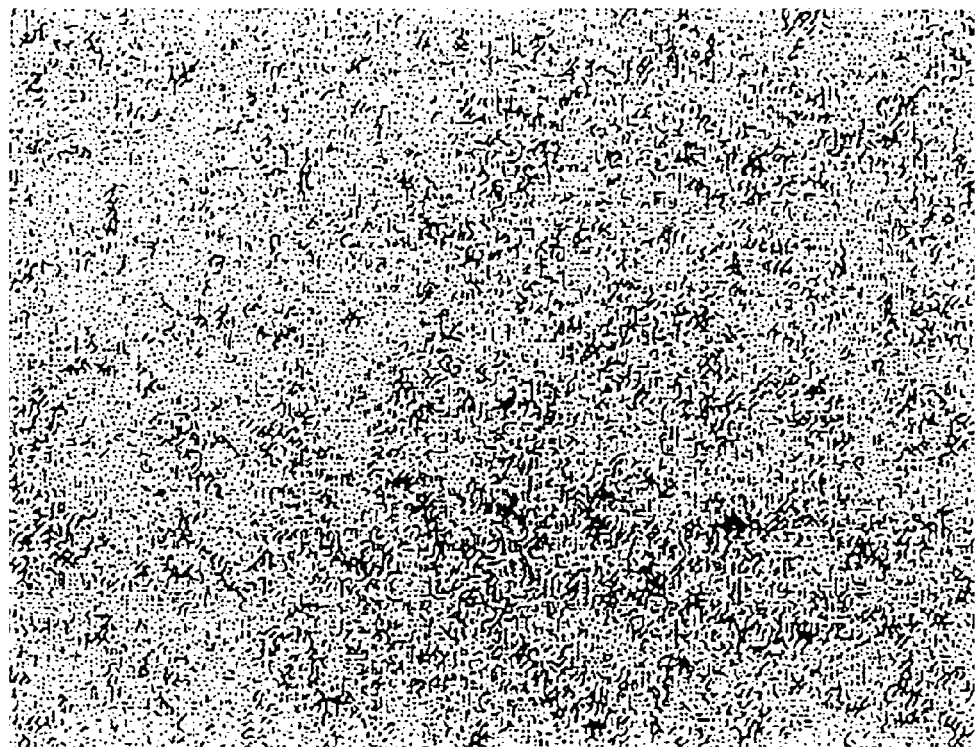
FIG. 5 is a copy of an SEM-photograph showing a surface of a deposited titanium metal layer which is heat-treated and deposited over a GaN base layer in preferred embodiments according to the present invention.
Figure 6:
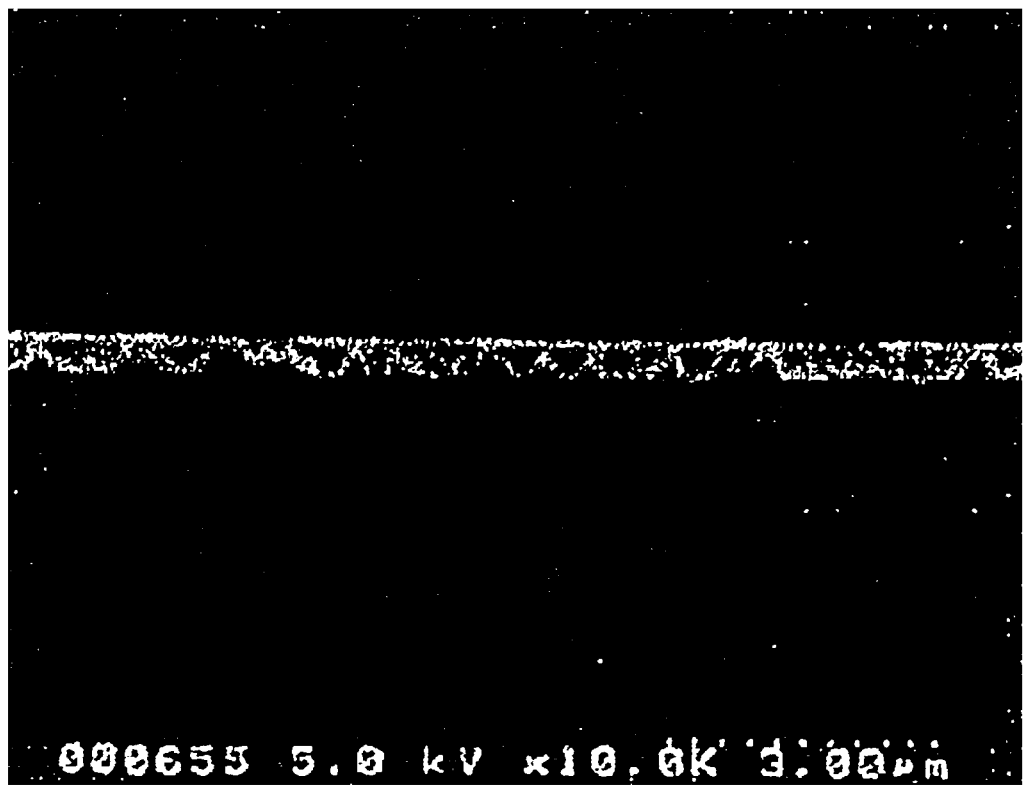
FIG. 6 is a copy of an SEM-photograph showing a section of a substrate structure with a deposited titanium metal layer which is heat-treated in preferred embodiments according to the present invention.

The substrate was put into a reaction chamber of MOCVD system. An ammonia gas containing 20% of $H_2$ gas was continuously supplied to the chamber. A heat treatment was carried out at 1050° C. for 30 minutes in the presence of a gas flow of $NH_3$ and $H_2$, whereby the titanium film is nitrated to form a titanium nitride film. The heat-treated substrate was again subjected to an X-ray diffraction measurement, a result of which is shown in FIG. 4. It was observed that the titanium nitride film has another crystal orientation to [111]. A surface and a section of the substrate were observed by scanning electron microscope (SEM) and which were conformed as shown in FIGS. 5 and 6 respectively. It was confirmed that the surface of the titanium nitride film has a uniform distribution of fine pores at an averaged distance of approximately 0.1 micrometers. The undoped epitaxial GaN layer underlying the titanium nitride film has another uniform distribution of voids of depths of at most approximately 400 nanometers with a generally inverted triangle shape. The undoped epitaxial GaN layer comprise a uniform distribution of generally triangle-shaped crystal pieces, topes of which substantially and mechanically support the bottom surface of the titanium nitride film. An approximately estimated porosity rate of the voids from the SEM photograph of the section of the substrate was about 65%.

EXAMPLE 2

Figure 2A:
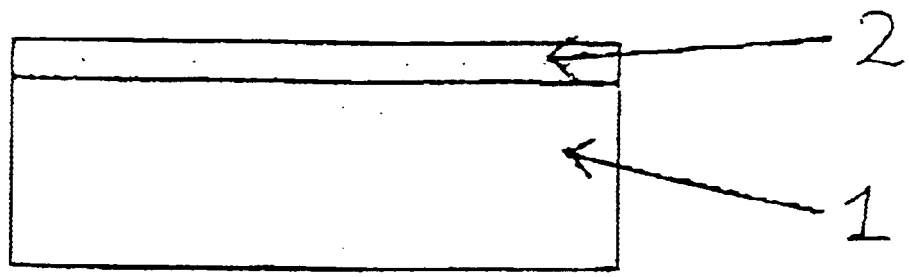
FIGS. 2A through 2D are fragmentary cross sectional elevation views of substrate structures in sequential steps involved in a novel method for forming an epitaxially grown GaN substrate structure in preferred embodiments according to the present invention.

With reference to FIG. 2A, a single crystal sapphire substrate 1 was prepared, which has a diameter of 2 inches and a surface with C-plane. An undoped epitaxial GaN layer 2 with a thickness of 400 nanometers was deposited on the C-plane of the single crystal sapphire substrate 1 by MOCVD using trimethyl gallium (TMG) and $NH_3$ as source gases.

Figure 2B:
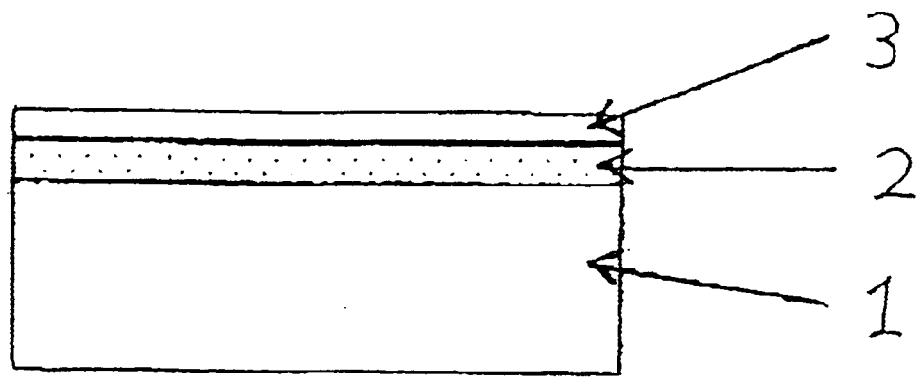

With reference to FIG. 2B, a titanium film 3 with a thickness of 20 nanometers was formed by evaporation on the undoped epitaxial GaN layer 2.

Figure 2C:
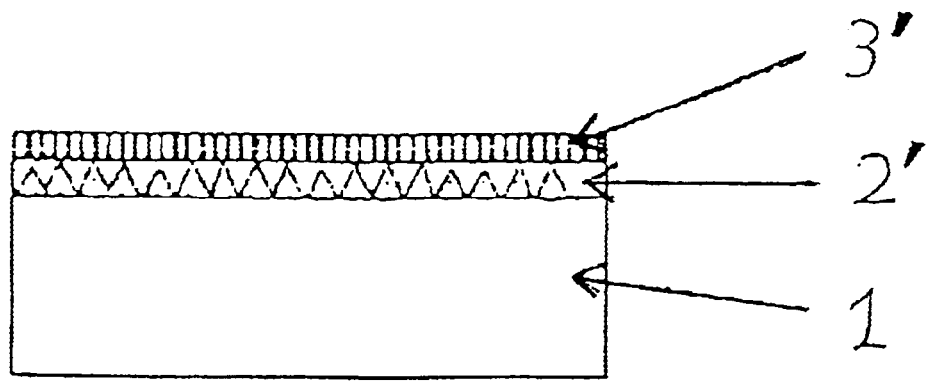

With reference to FIG. 2C, the substrate was put into a reaction chamber of MOCVD system. An ammonia gas containing 20% of $H_2$ gas was continuously supplied to the chamber. A heat treatment was carried out at 1050° C. for 30 minutes in the presence of a gas flow of $NH_3$ and $H_2$, whereby the titanium film 3 is nitrated to form a titanium nitride film 3'.

Figure 2D:
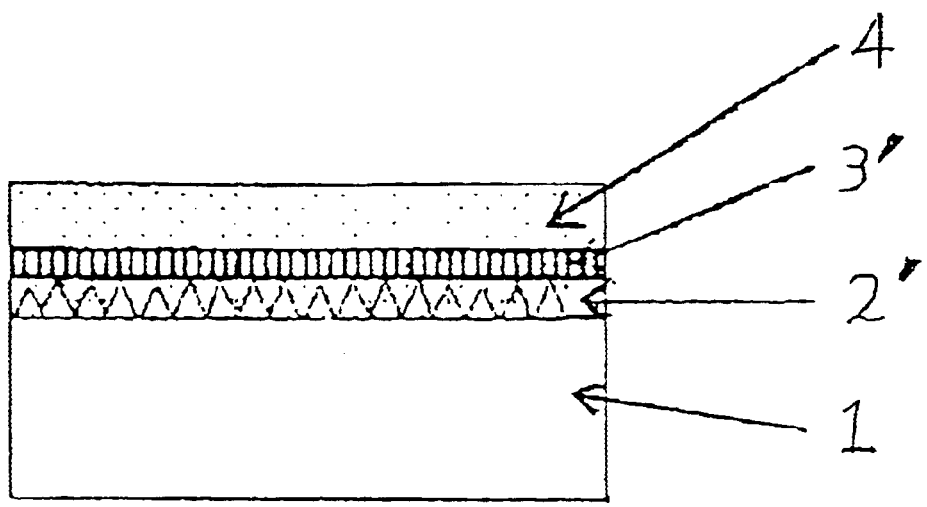

With reference to FIG. 2D, subsequently, without exposing the substrate to an outside atmosphere, the substrate was subjected to a further epitaxial growth 1050° C. with supplying trimethyl gallium (TMG) and $NH_3$ as source gases to form a GaN film 4 with a thickness of 2 micrometers over the titanium nitride layer 3'.

It was confirmed by microscope and SEM observations that a surface of the GaN epitaxial substrate has a higher planarity than another GaN epitaxial substrate surface which was obtained by using a buffer layer grown at a low temperature.

The substrate was cleaved and a section thereof was observed by SEM which is shown in FIG. 1. It was also confirmed that voids formed in the GaN base layer 2' have been completely filled with a part of the epitaxially grown GaN layer 4 which was grown after the heat treatment, and also that the epitaxially grown GaN layer 4 has a high surface planarity.

The surface of the substrate was observed by an interatomic force microscope to measure a pit density. The measured pit density was 2E6 $cm^{-2}$. It was confirmed that the GaN single crystal substrate has a desirable high crystal perfection.

The substrate was further subjected to the X-ray diffraction measurement. It was confirmed that throughout the surface of the substrate, a measured full width at half maximum of the (0002)-plane diffraction rocking curve was approximately 80 seconds, while another measured full width at half maximum of the (10—10)-plane diffraction rocking curve was approximately 130 seconds.

A surface roughness of the substrate was measured by a surface step measurement at five points, for example, center, two sets of diametrically opposite ends, which are positioned on two center-penetrating horizontal lines which are perpendicular to each other. It was confirmed that variation in the surface level was within ±0.1 micrometers with reference to a reference plane.

EXAMPLE 3

A single crystal sapphire substrate was prepared, which has a diameter of 2 inches and a surface with C-plane. An undoped epitaxial GaN layer with a thickness of 500 nanometers was deposited on the C-plane of the single crystal sapphire substrate by MOCVD using trimethyl gallium (TMG) and $NH_3$ as source gases. A titanium film with a thickness of 25 nanometers was formed by evaporation on the undoped epitaxial GaN layer. The substrate was put into a reaction chamber of MOCVD system. An argon gas containing 20% of $H_2$ gas was continuously supplied to the chamber. A first heat treatment was carried out at 1050° C. for 10 minutes in the presence of a gas flow of Ar and $H_2$. Subsequently, a second heat treatment was carried out at 1050° C. for 30 minutes in the presence of a gas flow of $NH_3$ and $H_2$. Thereafter, without exposing the substrate to an outside atmosphere, the substrate was subjected to a further epitaxial growth 1050° C. with supplying trimethyl gallium (TMG) and $NH_3$ as source gases to form an Si-doped GaN film with a thickness of 2 micrometers over the titanium nitride layer.

It was confirmed by microscope and SEM observations that a surface of the GaN epitaxial substrate has a higher planarity than another GaN epitaxial substrate surface which was obtained by using a buffer layer grown at a low temperature.

The substrate was further subjected to the X-ray diffraction measurement. It was confirmed that throughout the surface of the substrate, a measured full width at half maximum of the (0002)-plane diffraction rocking curve was approximately 120 seconds. The titanium nitride film was also subjected to the X-ray diffraction measurement. It was confirmed that another measured full width at half maximum of the (111)-plane diffraction rocking curve was confirmed which demonstrates that the titanium film was nitrated.

The substrate was cleaved and a section thereof was observed by SEM which is shown in FIG. 1. It was also confirmed that voids formed in the GaN base layer 2' have been completely filled with a part of the epitaxially grown GaN layer 4 which was grown after the heat treatment, and also that the epitaxially grown GaN layer 4 has a high surface planarity. It was difficult to clarify boundaries of void regions filled through observation based on the TEM photograph. It was, however, confirmed through the TEM observation that the dislocation density was reduced to approximately $1E8$ $cm^{-3}$ which is much lower than the dislocation density range of $1E9$ $cm^{-3}$ to $1E10$ $cm^{-3}$ which were usually observed by the GaN layer grown by MOCVD. This fact demonstrates that the voids were once formed and then filled with the epitaxial GaN crystal which is lower in dislocation density than the GaN base layer. Considering the known fact that almost no reduction of the dislocation density can be obtained by a mere heat treatment, thus if the dislocation density of the GaN base layer be reduced through the heat treatment and subsequent epitaxial growth, then this means that the voids were once formed and then filled with the epitaxial GaN crystal which is lower in dislocation density than the GaN base layer.

It was also confirmed that the above growth method was good in re-productivity over 10 runs.

EXAMPLE 4

A single crystal sapphire substrate was prepared, which has a diameter of 2 inches and a surface with C-plane. An undoped epitaxial GaN layer with a thickness of 500 nanometers was deposited on the C-plane of the single crystal sapphire substrate by MOCVD using trimethyl gallium (TMG) and $NH_3$ as source gases. A titanium film with a thickness of 30 nanometers was formed by evaporation on the undoped epitaxial GaN layer. The substrate was put into a reaction chamber of MOCVD system. A mixture gas containing 80% of $H_2$ gas and 20% of $NH_3$ gas was continuously supplied to the chamber. A heat treatment was carried out at 1050° C. for 30 minutes in the presence of a gas flow of $NH_3$ and $H_2$, whereby the titanium film is nitrated to form a titanium nitride film.

The substrate was once picked out from the reaction chamber and it was confirmed by microscope that the titanium nitride film has a generally uniform distribution of fine pores similar to what is shown in FIG. 5. Thereafter, the substrate was put into a reaction chamber of HVPE system. A mixture gas containing $NH_3$ gas and GaCl gas as source gases was continuously supplied to the chamber. An epitaxial growth was carried out at 1050° C. under an atmospheric pressure at a deposition rate of 80 micrometers/hour, thereby forming a GaN film with a thickness of 300 micrometers over the titanium nitride layer 3'.

It was confirmed by microscope and SEM observations that a surface of the GaN epitaxial substrate has a higher planarity and a much lower step in surface morphology as compared to an epitaxial GaN substrate which was obtained by using a conventional HVPE selective growth using an $SiO_2$ mask.

The substrate was cleaved and a section thereof was observed by SEM. It was also confirmed that voids formed in the GaN base layer have been completely filled with a part of the epitaxially grown GaN layer which was grown after the heat treatment, and also that the epitaxially grown GaN layer has a high surface planarity.

The surface of the substrate was exposed to an etching process in a mixture etching solution having a temperature of 250° C. and including a phosphoric acid and a sulfuric acid for 120 minutes. A surface pit density of the etched substrate was measured by SEM. The measured pit density was $1E7$ $cm^{-2}$. It was confirmed that the GaN single crystal substrate has a desirable high crystal perfection.

The substrate was further subjected to the X-ray diffraction measurement. It was confirmed that throughout the surface of the substrate, a measured full width at half maximum of the (0002)-plane diffraction rocking curve was approximately 90 seconds, while another measured full width at half maximum of the (10—10)-plane diffraction rocking curve was approximately 150 seconds.

A surface roughness of the substrate was measured by a surface step measurement at five points, for example, center, two sets of diametrically opposite ends, which are positioned on two center-penetrating horizontal lines which are perpendicular to each other. It was confirmed that variation in the surface level was within ±0.1 micrometers with reference to a reference plane.

EXAMPLE 5

Figure 7A:
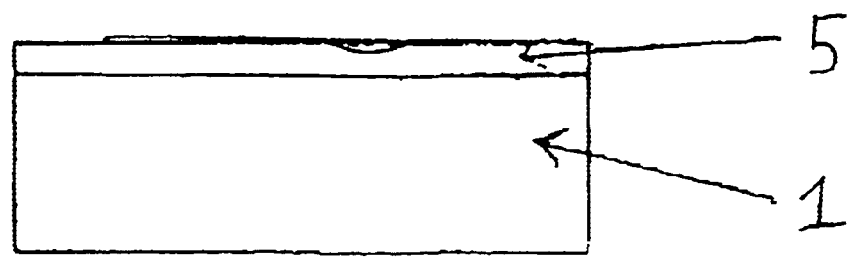
FIGS. 7A through 7H are fragmentary cross sectional elevation views of substrate structures in sequential steps involved in a novel method for forming an epitaxially grown GaN substrate structure in preferred embodiments according to the present invention.

With reference to FIG. 7A, a single crystal sapphire substrate 1 was prepared, which has a diameter of 2 inches and a surface with C-plane. An undoped epitaxial GaN layer 5 with a thickness of 1 micrometer was deposited on the C-plane of the single crystal sapphire substrate 1 by MOCVD using trimethyl gallium (TMG) and $NH_3$ as source gases.

Figure 7B:
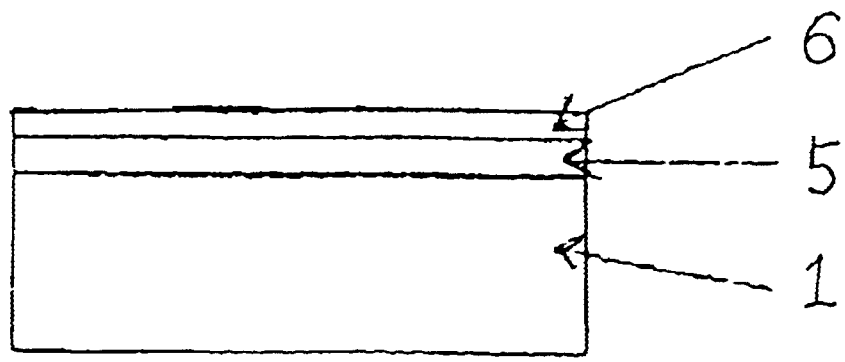

With reference to FIG. 7B, an $SiO_2$ film 6 with a thickness of 0.5 micrometers was deposited on the undoped epitaxial GaN layer 5 by a thermal CVD method.

Figure 7C:
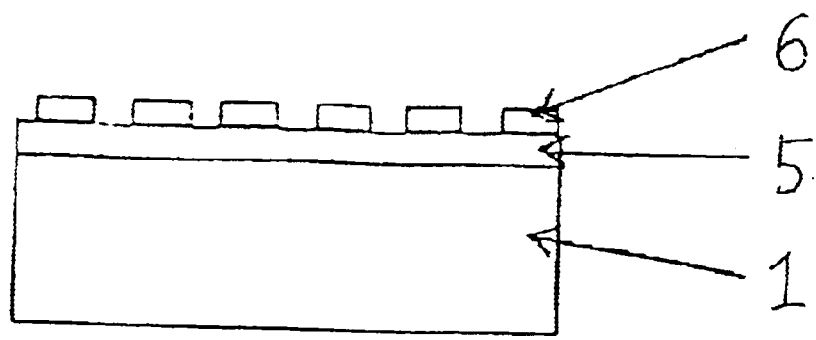

With reference to FIG. 7C, a resist was applied onto the $SiO_2$ film 6. The resist was then subjected to an exposure and a subsequent development to form a resist pattern. The $SiO_2$ film 6 was selectively etched by the resist pattern as an etching mask to form an $SiO_2$ mask 6 with stripe shape windows having a longitudinal direction which is parallel to a direction <11–20>, so that parts of the surface of the GaN layer was exposed through the windows. The each window has a width of 3 micrometers, while a distance of the adjacent two of the windows has a width of 7 micrometers.

Figure 7D:
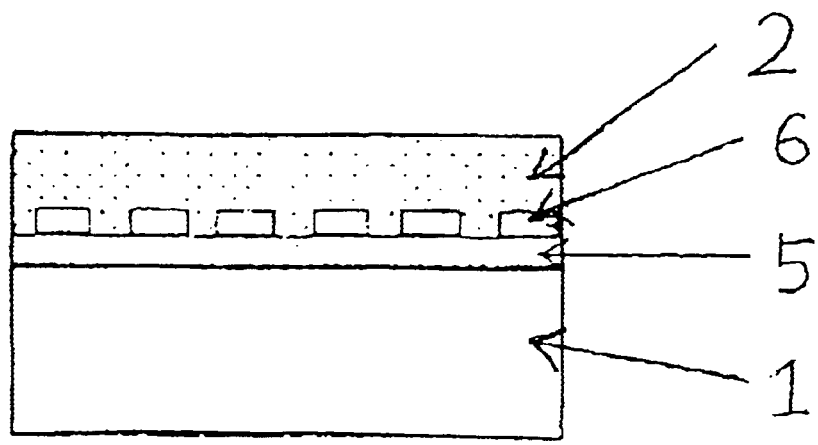

With reference to FIG. 7D, the substrate was put into a reaction chamber of HVPE system. A mixture gas containing $NH_3$ gas and GaCl gas as source gases was continuously supplied to the chamber. An epitaxial growth was carried out at 1050° C. under an atmospheric pressure at a deposition rate of 80 micrometers/hour, thereby forming a GaN film 2 with a thickness of 100 micrometers over the $SiO_2$ mask 6 and the titanium nitride layer 5. In the initial growth, the windows of the $SiO_2$ mask 6 were filled with the GaN and then the GaN film 2 was grown over the $SiO_2$ mask 61.

Figure 7E:
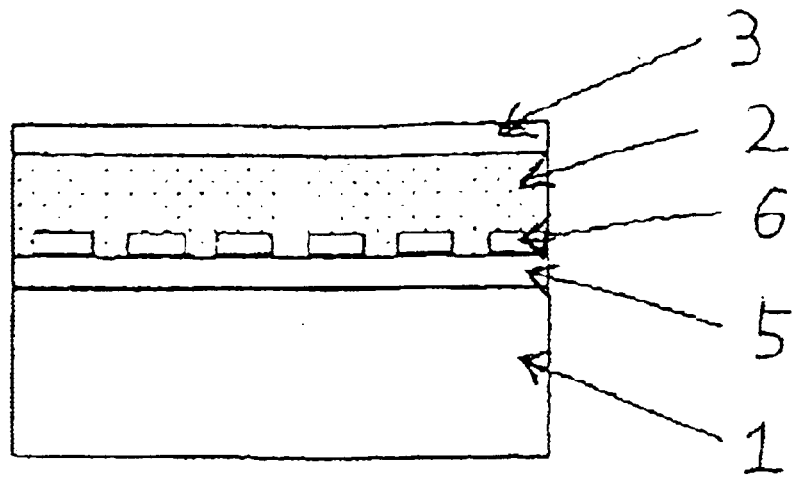

With reference to FIG. 7E, a titanium film with a thickness of 30 nanometers was formed by evaporation on the undoped epitaxial GaN layer.

Figure 7F:
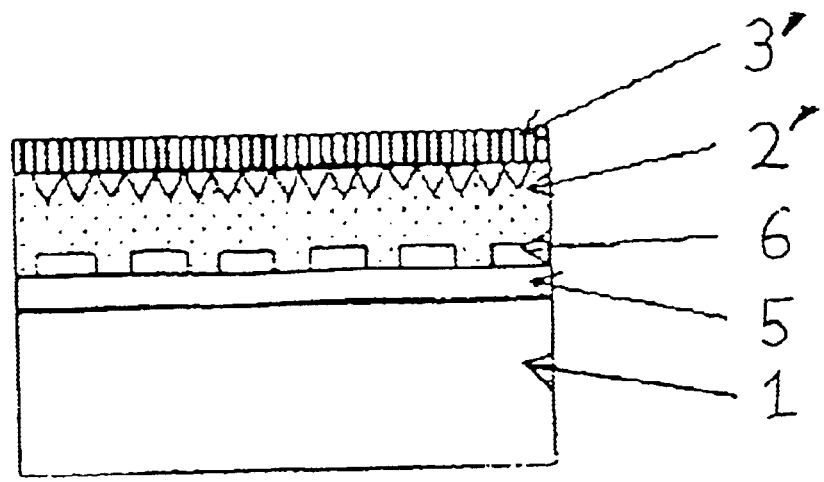

With reference to FIG. 7F, the substrate was put into a reaction chamber of MOCVD system. A mixture gas containing 50% of $H_2$ gas and 50% of $NH_3$ gas was continuously supplied to the chamber. A heat treatment was carried out at 1040° C. for 40 minutes in the presence of a gas flow of $NH_3$ and $H_2$, whereby the titanium film is nitrated to form a titanium nitride film 2' with voids.

Figure 7G:
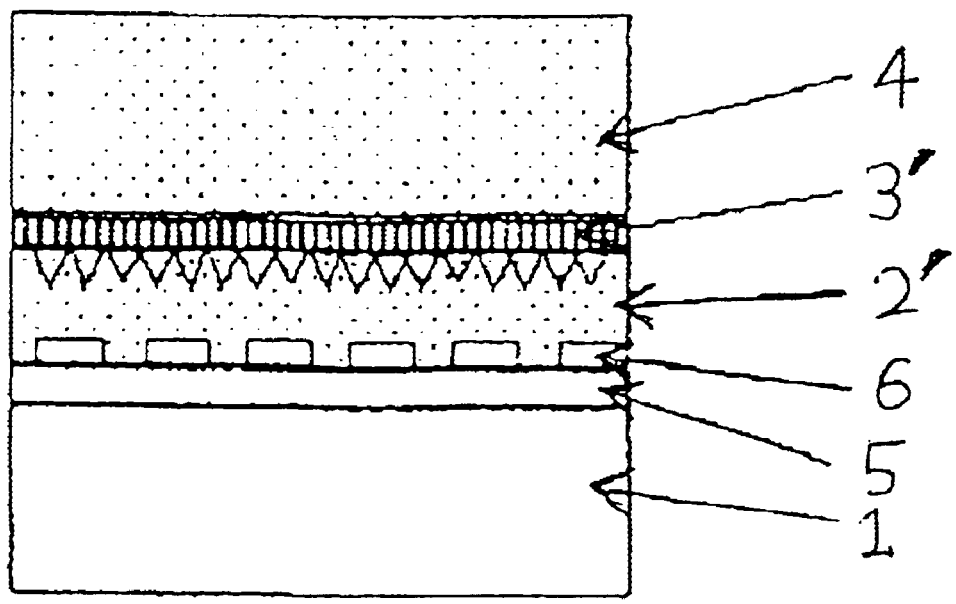

With reference to FIG. 7G, the substrate was once picked out from the reaction chamber and then placed into the HVPE reaction chamber again. A mixture gas containing $NH_3$ gas and GaCl gas as source gases with a dopant of SiH$_2$Cl$_2$ was continuously supplied to the chamber. An epitaxial growth was carried out at 1050° C., thereby forming an Si-doped GaN film 4 with a thickness of 300 micrometers over the titanium nitride layer 3'.

The surface of the substrate was observed by an interatomic force microscope to measure a pit density. The measured pit density was 1E6 cm$^{-2}$. It was confined that the GaN single crystal substrate has a desirable high crystal perfection.

The substrate was further subjected to the X-ray diffraction measurement. It was confirmed that throughout the surface of the substrate, a measured full width at half maximum of the (0002)-plane diffraction rocking curve was approximately 80 seconds, while another measured full width at half maximum of the (10—10)-plane diffraction rocking curve was approximately 110 seconds.

A surface roughness of the substrate was measured by a surface step measurement at five points, for example, center, two sets of diametrically opposite ends, which are positioned on two center-penetrating horizontal lines which are perpendicular to each other. It was confirmed that variation in the surface level was within ±0.15 micrometers with reference to a reference plane.

EXAMPLE 6

Figure 7H:
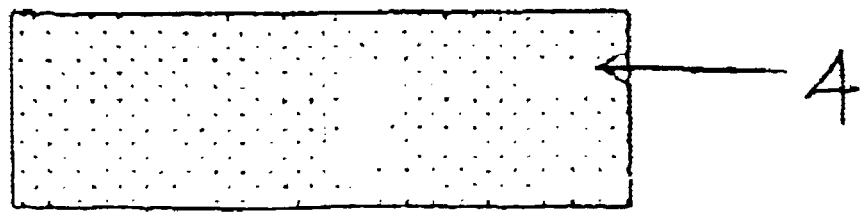

The GaN epitaxial substrate obtained by Example 5 and shown in FIG. 7G was dipped into a mixture solution containing hydrofluoric acid and nitric acid. The titanium nitride layer is etched selectively, whereby the GaN layer was peeled from the substrate without breaking and cracking, resulting in a single-layered GaN substrate 4 with a thickness of 300 micrometers shown in FIG. 7H having been obtained.

A chamber of the single-layered GaN substrate 4 was measured. A measured radium of curvature in connection with the chamber of the single-layered GaN substrate 4 was about 2 meters. It was confirmed that that the single-layered GaN substrate 4 is relatively flat.

EXAMPLE 7

With reference to FIG. 2A, a single crystal sapphire substrate 1 was prepared, which has a diameter of 2 inches and a surface with C-plane. An undoped epitaxial GaN layer 2 with a thickness of 400 nanometers was deposited on the C-plane of the single crystal sapphire substrate 1 by MOCVD using trimethyl gallium (TMG) and NH$_3$ as source gases.

Figure 8A:
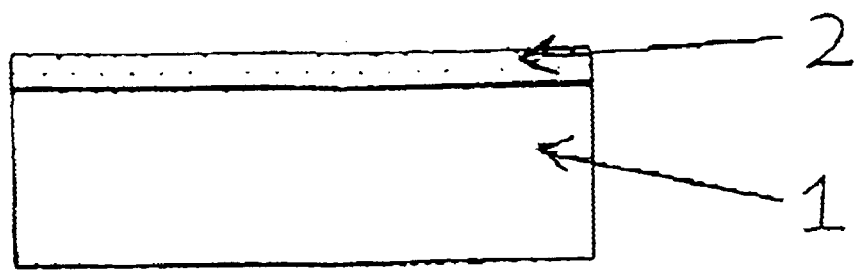
FIGS. 8A through 8I are fragmentary cross sectional elevation views of substrate structures in sequential steps involved in a novel method for forming an epitaxially grown GaN substrate structure in preferred embodiments according to the present invention.
Figure 8B:
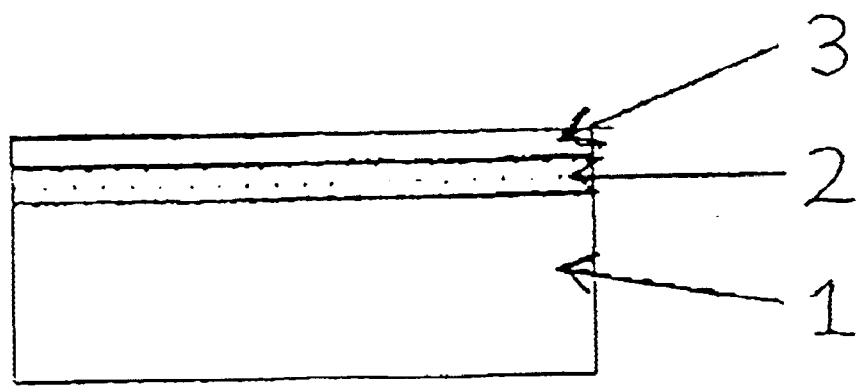

With reference to FIG. 8B, a titanium film 3 with a thickness of 20 nanometers was formed by evaporation on the undoped epitaxial GaN layer 2.

Figure 8C:
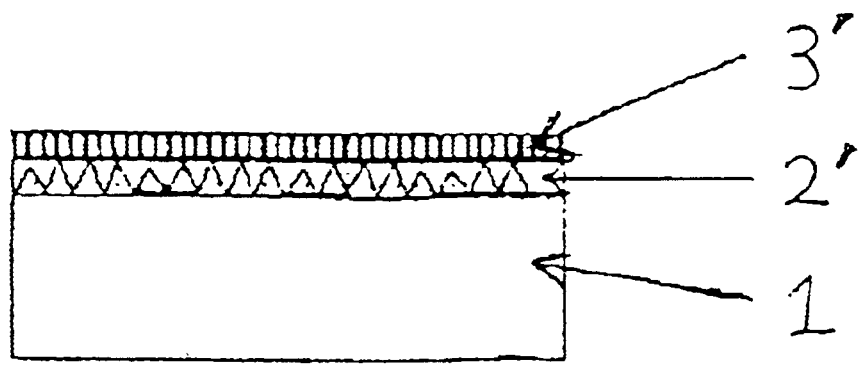

With reference to FIG. 8C, the substrate was put into a reaction chamber of MOCVD system. An ammonia gas containing 20% of H$_2$ gas was continuously supplied to the chamber. A heat treatment was carried out at 1050° C. for 30 minutes in the presence of a gas flow of NH$_3$ and H$_2$, whereby the titanium film 3 is nitrated to form a titanium nitride film 3'.

Figure 8D:
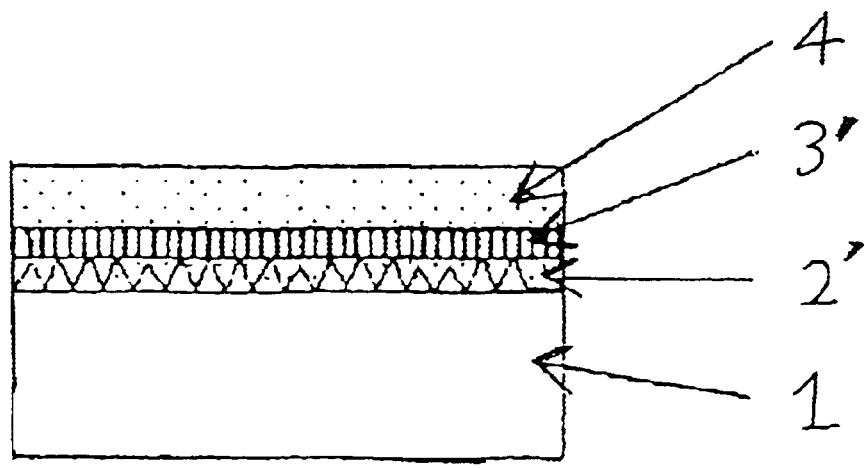

With reference to FIG. 8D, subsequently, without exposing the substrate to an outside atmosphere, the substrate was subjected to a further epitaxial growth 1050° C. with supplying trimethyl gallium (TMG) and NH$_3$ as source gases to form a GaN film 4 with a thickness of 2 micrometers over the titanium nitride layer 3'.

Figure 8E:
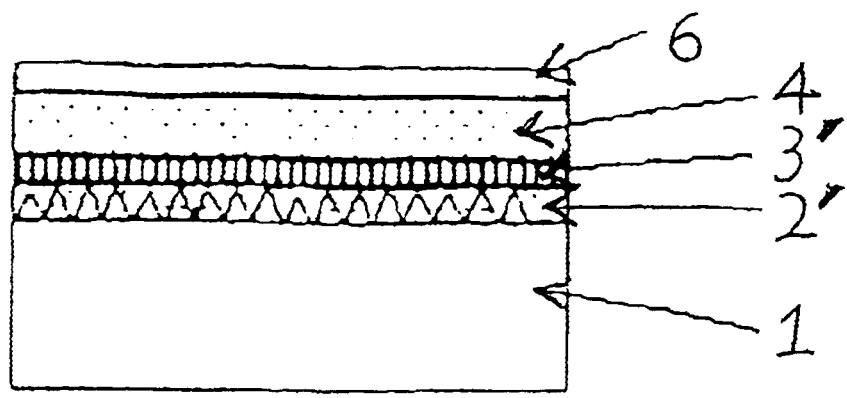

With reference to FIG. 8E, an SiO$_2$ film 6 with a thickness of 0.5 micrometers was deposited on the GaN film 4 by a thermal CVD method.

Figure 8F:
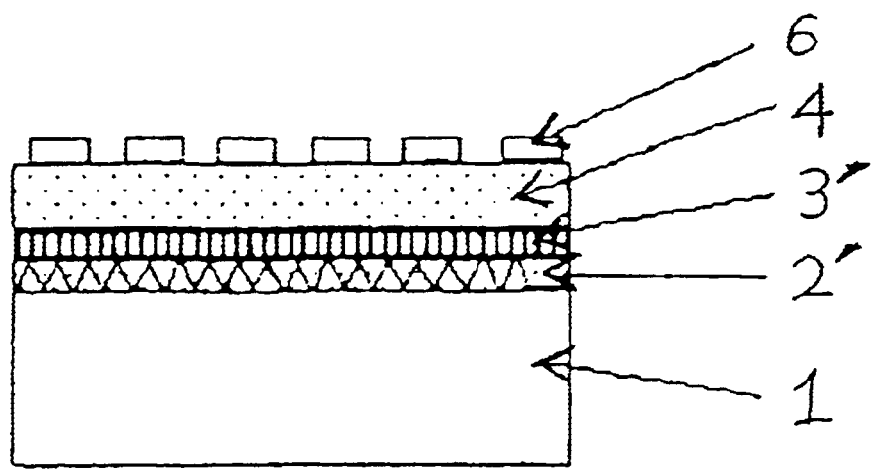

With reference to FIG. 8F, a resist was applied onto the SiO$_2$ film 6. The resist was then subjected to an exposure and a subsequent development to form a resist pattern. The SiO$_2$ film 6 was selectively etched by the resist pattern as an etching mask to form an SiO$_2$ mask 6 with stripe shape windows having a longitudinal direction which is parallel to a direction <11–20>, so that parts of the surface of the GaN layer 4 was exposed through the windows. The each window has a width of 3 micrometers, while a distance of the adjacent two of the windows has a width of 7 micrometers.

Figure 8G:
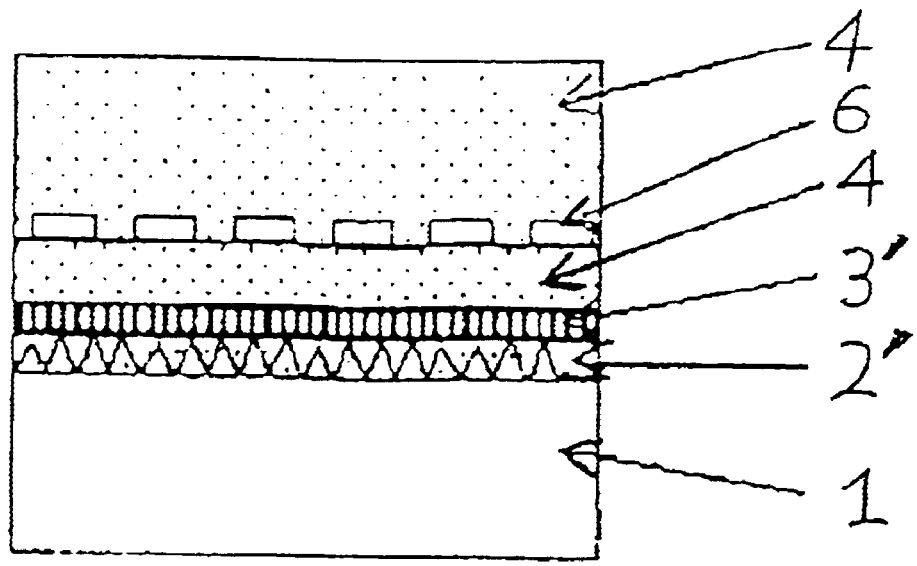

With reference to FIG. 8G, the substrate was put into a reaction chamber of HVPE system. A mixture gas containing NH$_3$ gas and GaCl gas as source gases was continuously supplied to the chamber. An epitaxial growth was carried out at 1050° C. under an atmospheric pressure at a deposition rate of 80 micrometers/hour, thereby forming an upper GaN film 4 over the SiO$_2$ mask 6 and the GaN film 4. In the initial growth, the windows of the SiO$_2$ mask 6 were filled with the GaN and then the GaN film 4 was grown over the SiO$_2$ mask 6.

The obtained surface of the substrate was exposed to an etching process in a mixture etching solution having a temperature of 250° C. and including a phosphoric acid and a sulfuric acid for 120 minutes. A surface pit density of the etched substrate was measured by SEM. The measured pit density was 9E5 cm$^{-2}$. It was confirmed that the GaN single crystal substrate has a desirable high crystal perfection.

EXAMPLE 8

Figure 8H:
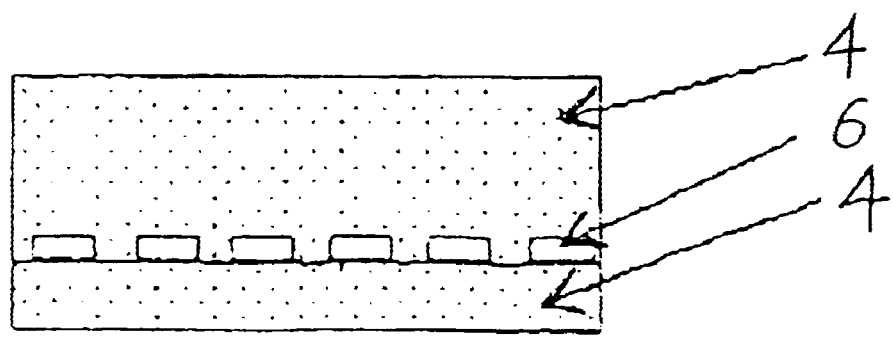
Figure 8I:

The GaN epitaxial substrate obtained by Example 7 and shown in FIG. 8G was dipped into a mixture solution containing hydrofluoric acid and nitric acid. As shown in FIG. 8H, the titanium nitride layer 3' is etched selectively, whereby the GaN layer 4 containing the SiO$_2$ mask 6 was peeled from the substrate without breaking and cracking. A bottom surface of the GaN layer 4 containing the SiO$_2$ mask 6 was polished so that the SiO$_2$ mask 6 is removed, resulting in a single-layered GaN substrate 4 with a thickness of 300 micrometers shown in FIG. 8I having been obtained.

Although the invention has been described above in connection with several preferred embodiments therefor, it will be appreciated that those embodiments have been provided solely for illustrating the invention, and not in a limiting sense. For example, the disclosed examples use titanium or Ti-containing alloys for the metal layer. However, Fe, Ni, Zr, Hf, W or Pt could be used for the metal layer. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A method of forming an epitaxially grown nitride-based compound semiconductor crystal substrate structure, said method comprising:

forming, directly on a nitride-based compound semiconductor base layer, a metal layer including at least one selected from the group consisting of metals which promote, with assistance of a thermal energy, removal of constitutional atoms of said nitride-based compound semiconductor base layer;

forming pores penetrating said metal layer and voids in said nitride-based compound semiconductor base layer with supply of a thermal energy; and epitaxially growing a nitride-based compound semiconductor crystal with filling said voids in an initial process and subsequently over said metal layer in a main process to form an epitaxially grown nitride-based compound semiconductor crystal layer over said metal layer.

2. The method as claimed in claim 1, wherein a nitride of said at least one selected metal for said metal layer has a lower free energy than a free energy of said nitride-based compound semiconductor base layer.

3. The method as claimed in claim 2, wherein said at least one selected metal includes Ti, Ti-containing alloys, Fe, Ni, Zr, Hf, W, and Pt.

4. The method as claimed in claim 1, wherein said voids have an averaged depth of not less than 10 nanometers.

5. The method as claimed in claim 1, wherein said voids are formed at a porosity rate in the range of 10% to 90%.

6. The method as claimed in claim 1, wherein said metal layer has a thickness of not more than 500 nanometers.

7. The method as claimed in claim 1, wherein said thermal energy is supplied by a heat treatment at a temperature of not less than 700° C.

8. The method as claimed in claim 7, wherein said heat treatment is carried out in the presence of hydrogen.

9. The method as claimed in claim 8, wherein said heat treatment is carried out in the presence of a mixture gas containing hydrogen and nitrogen.

10. The method as claimed in claim 7, wherein said heat treatment and said epitaxial growth process for said nitride-based semiconductor crystal are carried out in a same reaction chamber sequentially without exposure to an open atmosphere.

11. The method as claimed in claim 1, wherein said pores are uniformly distributed over said metal layer, and said voids are also uniformly distributed over said nitride-based compound semiconductor base layer.

12. The method as claimed in claim 11, wherein said pores are formed in said metal layer at an averaged pore diameter in the order of 0.1 micrometer and at an averaged distance between adjacent twos of said pores in the order of 0.1 micrometer.

13. The method as claimed in claim 1, wherein said nitride-based compound semiconductor crystal within said voids is lower in dislocation density than said nitride-based compound semiconductor base layer over said metal layer.

14. The method as claimed in claim 1, wherein said epitaxially grown nitride-based compound semiconductor crystal includes a surface region which has a dislocation density of 1E8 cm$^{-2}$.

15. The method as claimed in claim 14, wherein said surface region of said epitaxially grown nitride-based compound semiconductor crystal has a surface planarity within ±0.2 micrometers in a length order of 500 micrometers.

16. The method as claimed in claim 14, wherein, of said surface region of said epitaxially grown nitride-based compound semiconductor crystal, a full width at half maximum of a (0002)-diffraction rocking curve and another full width at half maximum of a (10—10)-diffraction rocking curve are both at most 0.1 degree respectively.

17. The method as claimed in claim 1, wherein said surface region of said epitaxially grown nitride-based compound semiconductor crystal has a C-plane.

18. The method as claimed in claim 17, wherein said nitride-based compound semiconductor base layer has a surface generally oriented to [0001], and said metal layer has a hexagonal crystal structure generally oriented to [0001].

19. The method as claimed in claim 17, wherein said nitride-based compound semiconductor base layer has a surface generally oriented to [0001], and said metal layer has a cubic crystal structure generally oriented to [111].

20. The method as claimed in claim 1, further comprising:
forming said nitride-based compound semiconductor base layer over a crystal supporting substrate.

21. The method as claimed in claim 20, further comprising:
removing said crystal supporting substrate, said nitride-based compound semiconductor base layer and said metal layer to form a single layered substrate structure of said epitaxially grown nitride-based compound semiconductor crystal.

22. The method as claimed in claim 1, further comprising:
forming a dielectric mask pattern over a crystal supporting substrate; and
epitaxially growing said nitride-based compound semiconductor base layer over said dielectric mask pattern.

23. The method as claimed in claim 22, further comprising:
removing said crystal supporting substrate, said dielectric mask pattern, said nitride-based compound semiconductor base layer and said metal layer to form a single layered substrate structure of said epitaxially grown nitride-based compound semiconductor crystal.

24. The method as claimed in claim 1, further comprising;
forming a dielectric mask pattern over said epitaxially grown nitride-based compound semiconductor crystal over said metal layer; and
further epitaxially growing a nitride-based compound semiconductor crystal top layer over said dielectric mask pattern.

25. The method as claimed in claim 24, further comprising:
removing said crystal supporting substrate, said nitride-based compound semiconductor base layer, said metal layer, said dielectric mask pattern, and said epitaxially grown nitride-based compound semiconductor crystal to form a single layered substrate structure of said nitride-based compound semiconductor crystal top layer.

26. A method of forming an epitaxially grown nitride-based compound semiconductor crystal substrate structure, said method comprising:
forming voids in a nitride-based compound semiconductor base layer and pores penetrating a metal layer directly on said nitride-based compound semiconductor base layer with supplying a thermal energy, wherein said metal layer includes at least one selected from the group consisting of metals which promote, with assistance of said thermal energy, removal of constitutional elements of said nitride-based compound semiconductor base layer; and
epitaxially growing a nitride-based compound semiconductor crystal with filling said voids in an initial process and subsequently over said metal layer in a main process to form an epitaxially grown nitride-based compound semiconductor crystal layer over said metal layer.

27. The method as claimed in claim 26, wherein a nitride of said at least one selected metal for said metal layer has a lower free energy than a free energy of said nitride-based compound semiconductor base layer.

28. The method as claimed in claim 26, wherein said voids have an averaged depth of not less than 10 nanometers.

29. The method as claimed in claim 26, wherein said voids are formed at a porosity rate in the range of 10% to 90%.

30. The method as claimed in claim 26, wherein said metal layer has a thickness of not more than 500 nanometers.

31. The method as claimed in claim 26, wherein said thermal energy is supplied by a heat treatment at a temperature of not less than 700° C.

32. The method as claimed in claim 26, wherein said nitride-based compound semiconductor crystal within said voids is lower in dislocation density than said nitride-based compound semiconductor base layer over said metal layer.

33. The method as claimed in claim 26, wherein said epitaxially grown nitride-based compound semiconductor crystal includes a surface region which has a dislocation density of 1E8 cm$^{-2}$.

34. The method as claimed in claim 33, wherein said surface region of said epitaxially grown nitride-based compound semiconductor crystal has a surface planarity within ±0.2 micrometers in a length order of 500 micrometers.

35. The method as claimed in claim 33, wherein, of said surface region of said epitaxially grown nitride-based compound semiconductor crystal, a full width at half maximum of a (0002)-diffraction rocking curve and another full width at half maximum of a (10—10)-diffraction rocking curve are both at most 0.1 degree respectively.

36. The method as claimed in claim 26, further comprising:

forming said nitride-based compound semiconductor base layer over a crystal supporting substrate.

37. The method as claimed in claim 36, further comprising:

removing said crystal supporting substrate, said nitride-based compound semiconductor base layer and said metal layer to form a single layered substrate structure of said epitaxially grown nitride-based compound semiconductor crystal.

38. The method as claimed in claim 26, further comprising:

forming a dielectric mask pattern over a crystal supporting substrate; and epitaxially growing said nitride-based compound semiconductor base layer over said dielectric mask pattern.

39. The method as claimed in claim 38, further comprising:

removing said crystal supporting substrate, said dielectric mask pattern, said nitride-based compound semiconductor base layer and said metal layer to form a single layered substrate structure of said epitaxially grown nitride-based compound semiconductor crystal.

40. The method as claimed in claim 26, further comprising:

forming a dielectric mask pattern over said epitaxially grown nitride-based compound semiconductor crystal over said metal layer; and further epitaxially growing a nitride-based compound semiconductor crystal top layer over said dielectric mask pattern.

41. The method as claimed in claim 40, further comprising:

removing said crystal supporting substrate, said nitride-based compound semiconductor base layer, said metal layer, said dielectric mask pattern, and said epitaxially grown nitride-based compound semiconductor crystal to form a single layered substrate structure of said nitride-based compound semiconductor crystal top layer.

42. A method of epitaxially growing a nitride-based compound semiconductor crystal, said method comprising:

forming voids in a nitride-based compound semiconductor base layer and pores penetrating a metal layer with supplying an energy in the presence of a direct contact between said nitride-based compound semiconductor base layer and said metal layer, wherein said metal layer includes at least one selected from the group consisting of metals which promote, with assistance of said energy, removal of constitutional atoms of said nitride-based compound semiconductor base layer; and carrying out an epitaxial growth of a nitride-based compound semiconductor crystal with filling said voids in an initial process and subsequently over said metal layer in a main process.

43. The method as claimed in claim 42, wherein a nitride of said at least one selected metal for said metal layer has a lower free energy than a free energy of said nitride-based compound semiconductor base layer.

44. The method as claimed in claim 42, wherein said voids have an averaged depth of not less than 10 nanometers.

45. The method as claimed in claim 42, wherein said voids are formed at a porosity rate in the range of 10% to 90%.

46. The method as claimed in claim 42, wherein said metal layer has a thickness of not more than 500 nanometers.

47. The method as claimed in claim 42, wherein said thermal energy is supplied by a heat treatment at a temperature of not less than 700° C.

48. The method as claimed in claim 42, wherein said nitride-based compound semiconductor crystal within said voids is lower in dislocation density than said nitride-based compound semiconductor base layer over said metal layer.

49. The method as claimed in claim 42, wherein said epitaxially grown nitride-based compound semiconductor crystal includes a surface region which has a dislocation density of 1E8 cm$^{-2}$.

50. The method as claimed in claim 49, wherein said surface region of said epitaxially grown nitride-based compound semiconductor crystal has a surface planarity within ±0.2 micrometers in a length order of 500 micrometers.

51. The method as claimed in claim 49, wherein, of said surface region of said epitaxially grown nitride-based compound semiconductor crystal, a full width at half maximum of a (0002)-diffraction rocking curve and another full width at half maximum of a (10—10)-diffraction rocking curve are both at most 0.1 degree respectively.

* * * * *